United States Patent
Pang et al.

(10) Patent No.: US 10,008,277 B2
(45) Date of Patent: *Jun. 26, 2018

(54) BLOCK HEALTH MONITORING USING THRESHOLD VOLTAGE OF DUMMY MEMORY CELLS

(71) Applicant: SanDisk Technologies LLC, Plano, TX (US)

(72) Inventors: Liang Pang, Fremont, CA (US); Xuehong Yu, San Jose, CA (US); Yingda Dong, San Jose, CA (US); Nian Niles Yang, Mountain View, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/262,262

(22) Filed: Sep. 12, 2016

(65) Prior Publication Data

US 2018/0075919 A1    Mar. 15, 2018

(51) Int. Cl.
*G11C 16/34* (2006.01)
*G11C 16/28* (2006.01)
*G11C 16/16* (2006.01)
*G11C 16/04* (2006.01)
*G11C 16/10* (2006.01)
(Continued)

(52) U.S. Cl.
CPC ...... *G11C 16/3495* (2013.01); *G11C 16/0466* (2013.01); *G11C 16/0483* (2013.01); *G11C 16/08* (2013.01); *G11C 16/10* (2013.01); *G11C 16/16* (2013.01); *G11C 16/28* (2013.01); *G11C 16/3445* (2013.01); *H01L 27/1157* (2013.01); *H01L 27/11582* (2013.01)

(58) Field of Classification Search
None
See application file for complete search history.

(56) References Cited

U.S. PATENT DOCUMENTS 8,023,332 B2 * 9/2011 Sarin ............... G11C 11/5621
                                                                365/185.2
8,369,141 B2    2/2013 Sommer et al.
(Continued)

OTHER PUBLICATIONS

International Search Report & the Written Opinion of the International Searching Authority dated Aug. 1, 2017, International Application No. PCT/US2017/034891.

*Primary Examiner* — James G Norman
(74) *Attorney, Agent, or Firm* — Vierra Magen Marcus LLP

(57) ABSTRACT

Techniques are provided for measuring the endurance of a set of data memory cells by evaluating the threshold voltage (Vth) of associated dummy memory cells. A cell has a high endurance or good data retention if it is able to maintain the charges. However, there can be a variation in the endurance of cells even within a single die. By evaluating the dummy memory cells, an early warning can be obtained of a degradation of the data memory cells. Moreover, there is no interference with the operation of the data memory cells. Based on a number of dummy memory cells which have a Vth below a demarcation voltage, a corrective action is taken such as adjusting read voltages, an initial program voltage and/or an initial erase voltage, or marking the block as being bad and recovering the data.

19 Claims, 19 Drawing Sheets

(51) Int. Cl.
    *G11C 16/08*         (2006.01)
    *H01L 27/1157*    (2017.01)
    *H01L 27/11582*  (2017.01)

(56) References Cited

U.S. PATENT DOCUMENTS

| | | |
|---|---|---|
| 9,299,450 B1 | 3/2016 | Pang et al. |
| 9,418,751 B1 | 8/2016 | Dutta et al. |
| 2006/0285408 A1* | 12/2006 | Betser ............... G11C 16/3404 365/212 |
| 2008/0062762 A1* | 3/2008 | Doyle ................ G11C 11/5642 365/185.11 |
| 2009/0135656 A1 | 5/2009 | Park |
| 2009/0141544 A1* | 6/2009 | Sakimura ........... G06F 11/1044 365/158 |
| 2010/0046289 A1 | 2/2010 | Baek et al. |
| 2012/0243329 A1 | 9/2012 | Nagashima |
| 2012/0327713 A1 | 12/2012 | Parat et al. |
| 2013/0083599 A1 | 4/2013 | Nam et al. |
| 2014/0160845 A1* | 6/2014 | Ratnam .................. G11C 29/42 365/185.09 |
| 2014/0219001 A1* | 8/2014 | Patapoutian ....... G11C 13/0002 365/148 |
| 2016/0103630 A1 | 4/2016 | Shen |
| 2016/0180959 A1 | 6/2016 | Darragh et al. |
| 2016/0211032 A1 | 7/2016 | Pang et al. |
| 2016/0276040 A1* | 9/2016 | Han ...................... G11C 16/28 |

\* cited by examiner

Fig. 8D
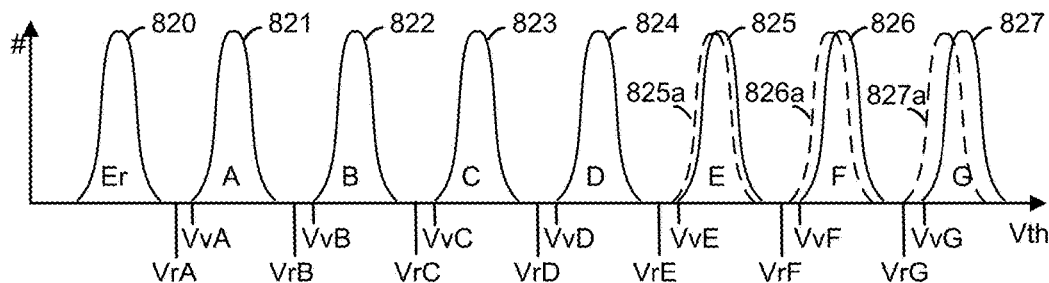
Fig. 8E
|  | Er | A | B | C | D | E | F | G |
|---|---|---|---|---|---|---|---|---|
| UP | 1 | 1 | 1 | 0 | 0 | 0 | 0 | 1 |
|  |  |  |  | ↑VrC |  |  |  | ↑VrG |
| MP | 1 | 1 | 0 | 0 | 1 | 1 | 0 | 0 |
|  |  |  | ↑VrB |  | ↑VrD |  | ↑VrF |  |
| LP | 1 | 0 | 0 | 0 | 0 | 1 | 1 | 1 |
|  |  | ↑VrA |  |  |  | ↑VrE |  |  |
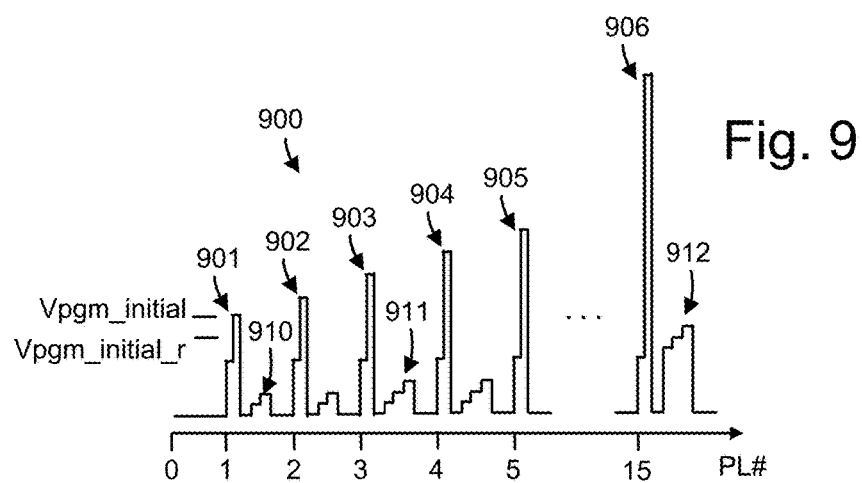
Fig. 9

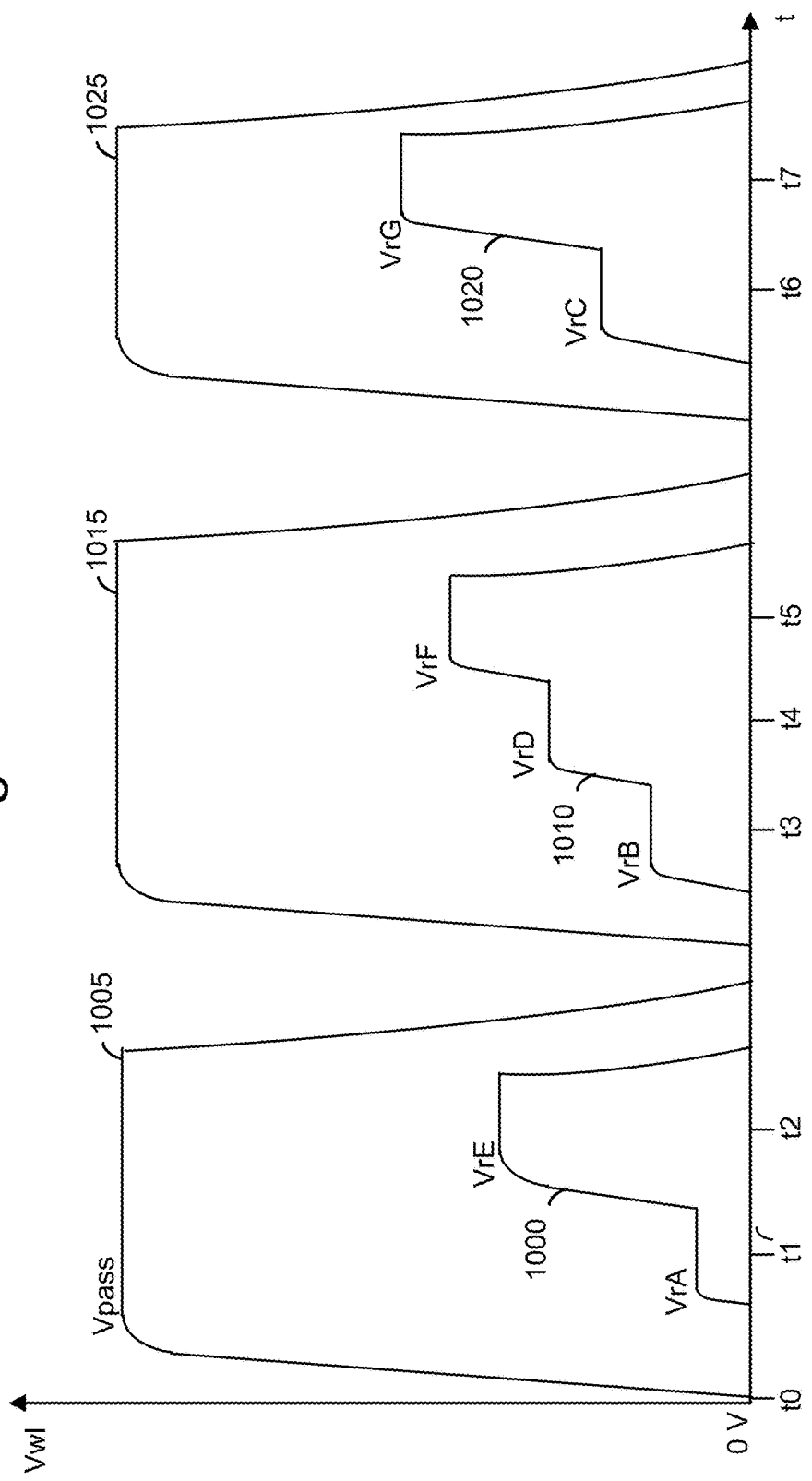

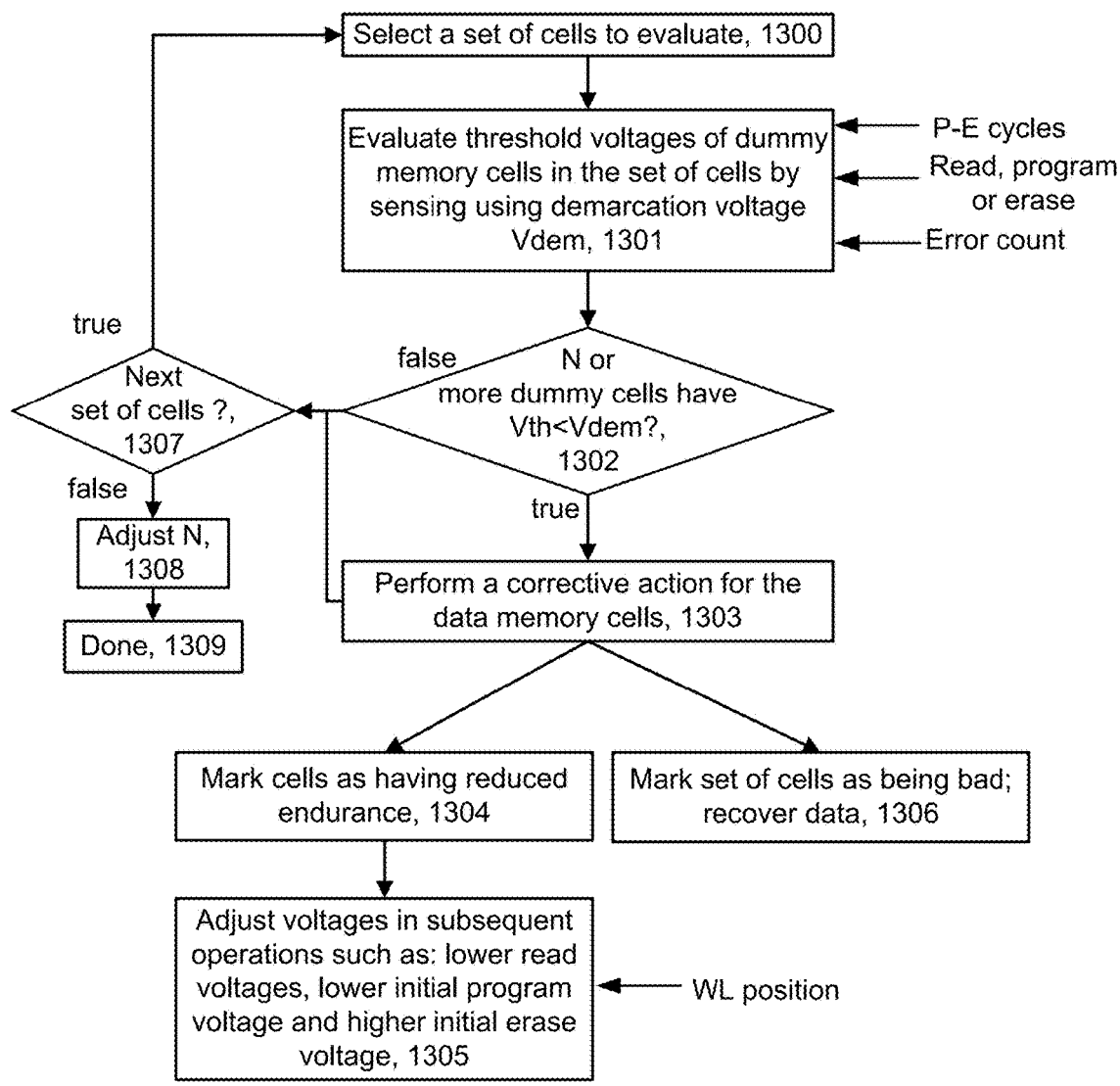

BLOCK HEALTH MONITORING USING THRESHOLD VOLTAGE OF DUMMY MEMORY CELLS

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 8D depicts example Vth distributions of memory cells, where eight data states are used.

FIG. 8E depicts bit sequences for lower, middle and upper pages of data, and associated read voltages, for the Vth distributions of FIG. 8D.

FIG. 9 depicts a waveform of an example programming operation.

FIG. 10A depicts read voltages and pass voltages in an example read operation, where lower, middle and upper pages are read separately.

FIG. 13A depicts an example process for evaluating dummy memory cells to determine whether to take a corrective action for associated data memory cells.

DETAILED DESCRIPTION

Figure 1:
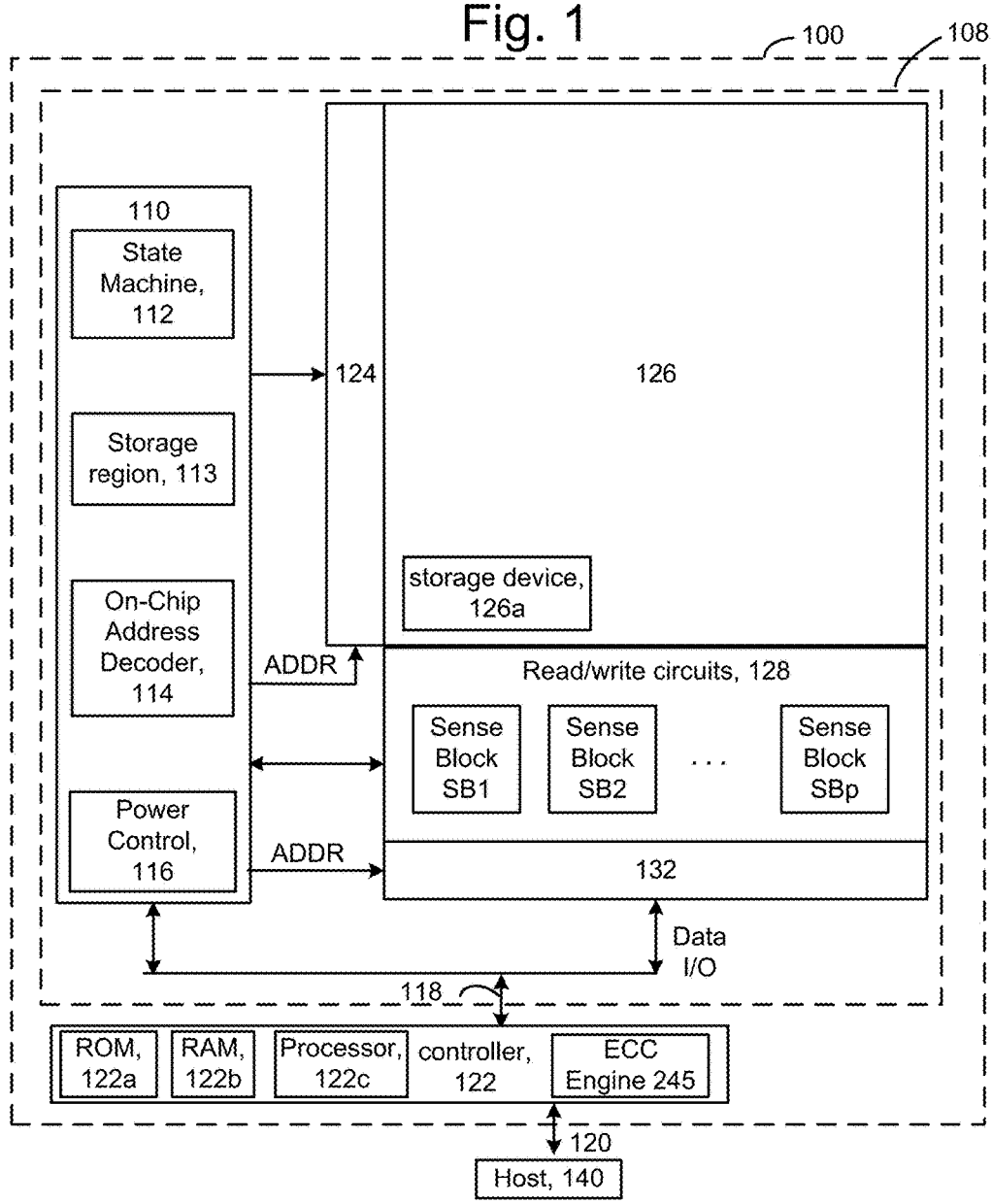
FIG. 1 is a block diagram of an example memory device.

Techniques are provided for monitoring the health of memory cells and taking a corrective action to avoid read errors. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state (Eslc) and the programmed state (Pslc) (see FIG. 8A). In a two-bit per cell memory device, there are four data states including the erased state and three higher data states referred to as the A, B and C data states (see FIG. 8B). In a three-bit per cell memory device, there are eight data states including the erased state and seven higher data states referred to as the A, B, C, D, E, F and G data states (see FIG. 8D). In a four-bit per cell memory device, there are sixteen data states including the erased state and fifteen higher data states, and so forth.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, the health of a set of memory cells can vary. Generally, a set of memory cells is considered to be healthy if the cells maintain charges in a charge-trapping material after being programmed. By maintaining the charges, a constant threshold voltage is achieved and the data can be read back accurately. A cell has a high endurance or good data retention if it is able to maintain the charges over time. However, there can be a variation in the endurance of cells even within a single die. For example, there can be a block to block variation. A small number of blocks may have a poor endurance due to variations in the fabrication process, e.g., variations in film thicknesses and doping concentrations. The endurance of these blocks may be worse when the memory device is in a high temperature environment. These blocks have a poor high temperature data retention. A block with poor endurance will have a high number of errors when data is read back from it.

Moreover, a block with poor endurance will be harder to erase. For instance, the number of erase loops may increase from four to six loops for a bad block (a block with excessive degradation), while it would remain at four loops for a good block, after 1000 program-erase (P-E) cycles. An erase voltage is applied across the cells in each erase loop. The increase in the number of erase loops can further degrade the endurance.

Techniques provided herein address the above and other issues. In one aspect, the health of dummy memory cells is evaluated to determine whether a corrective action is desirable for the data memory cells. By evaluating the dummy memory cells, there is no interference with the operation of the data memory cells. Moreover, the evaluation can occur at any desired time. The evaluation of the dummy memory cells can provide an early warning of an endurance problem with the data memory cells, before the problem becomes so great than data cannot be recovered from the data memory cells. The evaluation of the dummy memory cells can involve sensing the dummy memory cells using a demarcation voltage and counting a number of the dummy memory cells which have a threshold voltage below the demarcation voltage. If this number is above a threshold, a corrective action may be taken such as adjusting read voltages in a subsequent read operation or marking the block as being bad and recovering the data so it can be stored in another block. The evaluation can therefore quickly identify the small number of bad blocks.

The evaluation of the Vth of the dummy memory cells can provide a finer granularity and therefore an earlier warning than the evaluation of other metrics such as the number of erase loops.

In one aspect, the adjusting of the read voltages involves lowering read voltages for one or more higher data states. The adjustment may also be greater when the cells being read are on an edge word line of a set of word lines.

In another aspect, the evaluation and correction are made for a subset (a strict subset, fewer than all) of the memory cells in a block, such as a sub-block of cells.

In another aspect, the evaluation and correction are based on a number of program-erase cycles.

In another aspect, the threshold of the number of the dummy memory cells which have a threshold voltage below the demarcation voltage is dynamically adjusted based on an evaluation of threshold voltages of dummy memory cells in a blocks.

In another aspect, an initial program voltage is reduced or an initial erase voltage is increased for a set of memory cells with degraded endurance.

These and various other features and benefits are described below.

FIG. 1 is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for voltages to be applied to dummy and data word lines and select gates, as described further below, such as in evaluation and read operations. The storage region may store a default set of read voltages and one or more adjusted sets of read voltages. The storage region may store initial program and erase voltages. The storage region may also store a flag which is used by the processor 122c to indicate a level of endurance remaining in a set of memory cells. Based on this flag, the operation of the memory device may be modified such as by using modified read voltages in a read operation, setting a lower initial program voltage, or setting a higher initial erase voltage.

The on-chip address decoder 114 provides an address interface between that used by the host or a memory controller to the hardware address used by the decoders 124 and 132. The power control module 116 controls the power and voltages supplied to the word lines, select gate lines and bit lines during memory operations. It can include drivers for word lines, SGS and SGD transistors and source lines. See FIG. 16. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the flowcharts. For example, a control circuit may include any one of, or a combination of, control circuitry 110, state machine 112, decoders 114 and 132, power control module 116, sense blocks SBb, SB2, . . . , SBp, read/write circuits 128, controller 122, and so forth.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. The ECC engine may be used to count of number of errors in a read operation and use this number to determine whether to perform a coupling up of word lines, as discussed further below.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
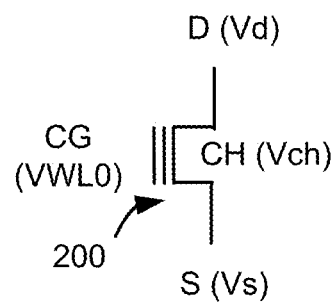
FIG. 2 depicts an example memory cell 200 in the memory structure 126.

FIG. 2 depicts an example memory cell 200 in the memory structure 126. The memory cell comprises a control gate CG which receives a word line voltage Vwll0, a drain at a voltage Vd, a source at a voltage Vs and a channel at a voltage Vch.

Figure 3:
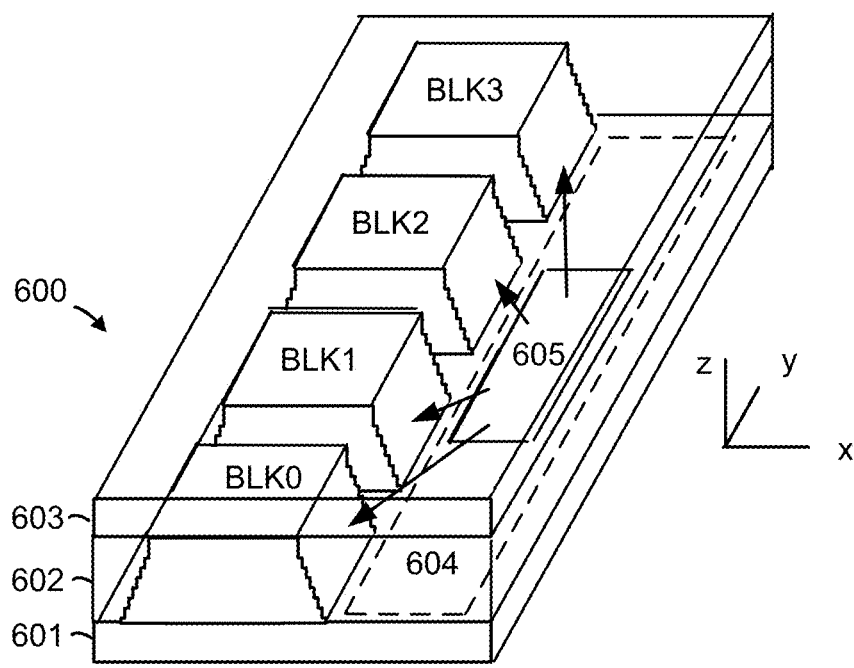
FIG. 3 is a perspective view of a memory device 600 comprising a set of blocks in an example 3D configuration of the memory structure 126 of FIG. 1.

FIG. 3 is a perspective view of a memory device 600 comprising a set of blocks in an example 3D configuration of the memory structure 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 4:
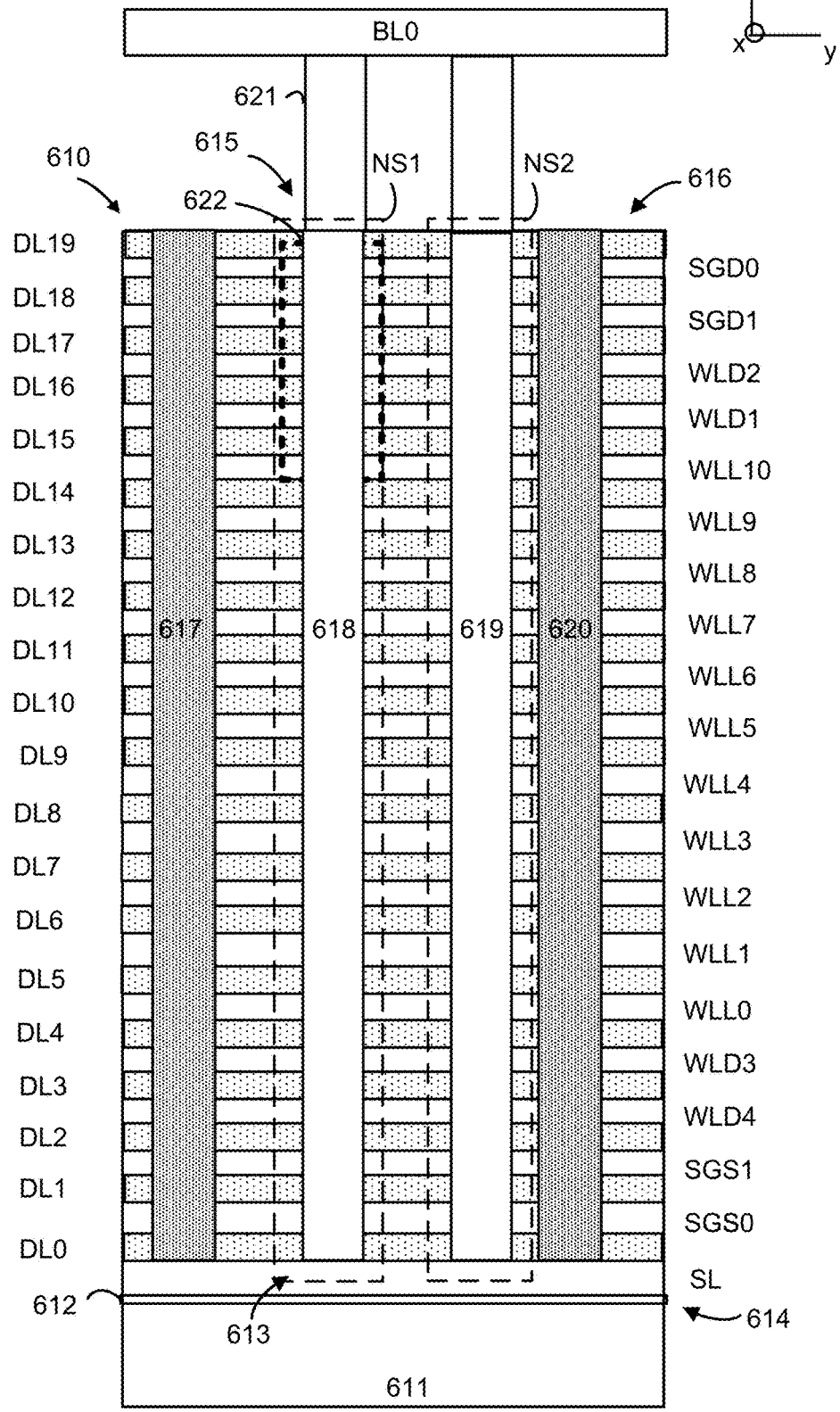
FIG. 4 depicts an example cross-sectional view of a portion of one of the blocks of FIG. 3.

FIG. 4 depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

The set of memory cells may be in a three-dimensional structure in a stack, where the stack comprises alternating conductive layers and dielectric layers, and the dielectric layers comprise word line layers for a set of memory cells.

Figure 5:
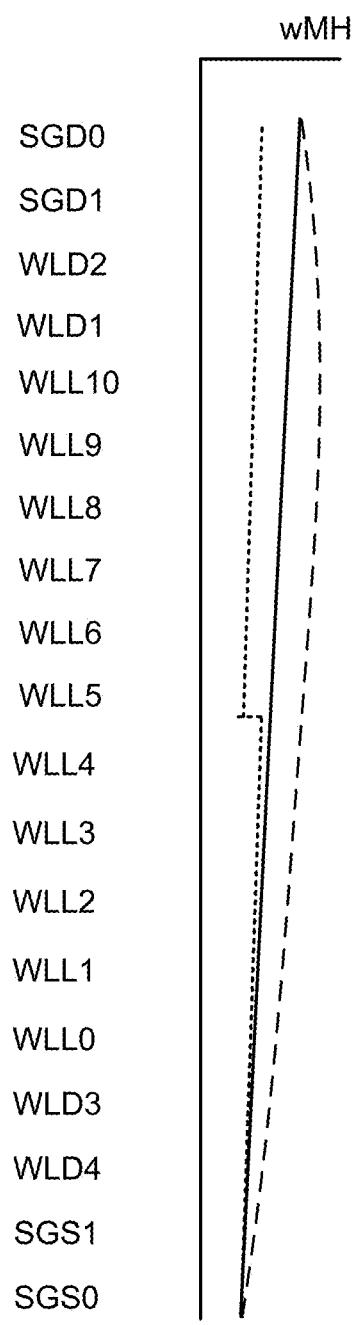
FIG. 5 depicts a plot of memory hole diameter in the stack of FIG. 4.

FIG. 5 depicts a plot of memory hole diameter in the stack of FIG. 4. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the width of the memory hole and the corresponding pillar which is formed by materials in the memory hole, including sidewall films and a core filler, can vary along the length of the hole. Typically, the diameter becomes progressively smaller from the top to the bottom of the memory hole (solid line in FIG. 5). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 5). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and pillar, the programming and erase speed of the memory cells can vary based on their position along the memory hole. With a relatively smaller diameter portion of a memory hole, the electric field across the tunnel oxide is relatively stronger, so that the programming and erase speed is higher.

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Figure 6:
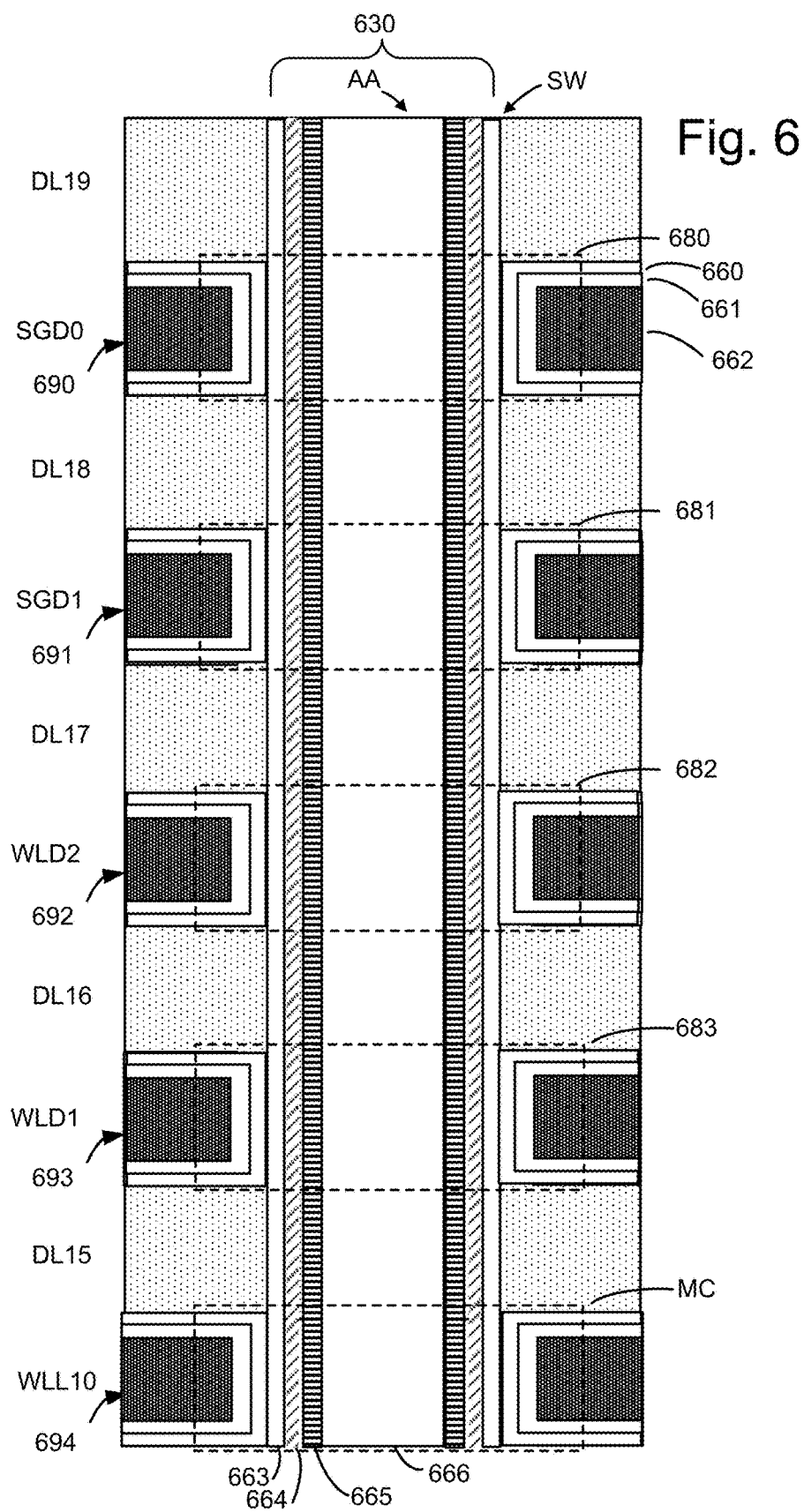
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer 663 or film such as SiN or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7A:
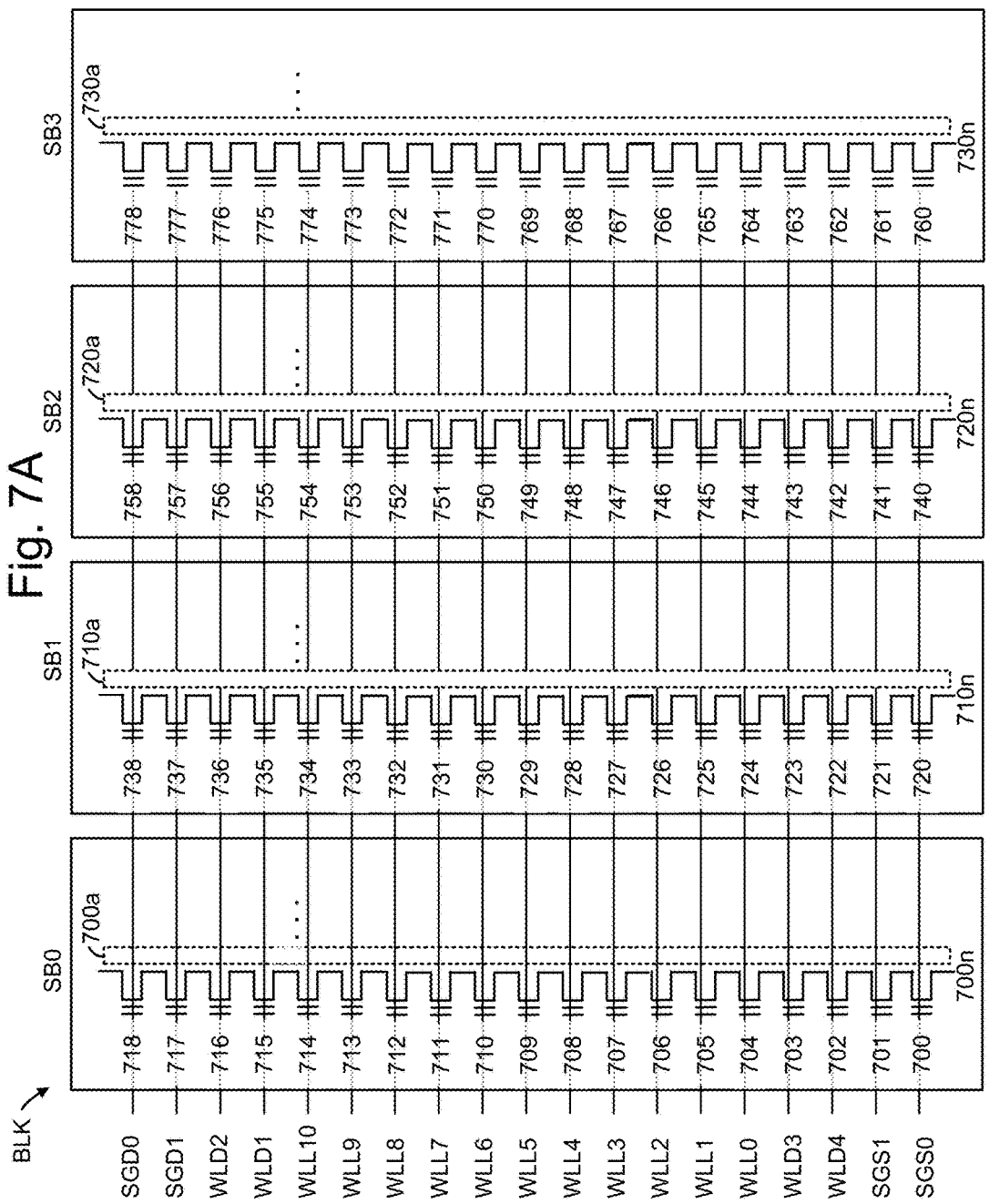
FIG. 7A depicts an example view of NAND strings in sub-blocks in a 3D configuration which is consistent with FIG. 4.

FIG. 7A depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 700n, 710n, 720n and 730n have channel regions 700a, 710a, 720a and 730a, respectively.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

Figure 7B:
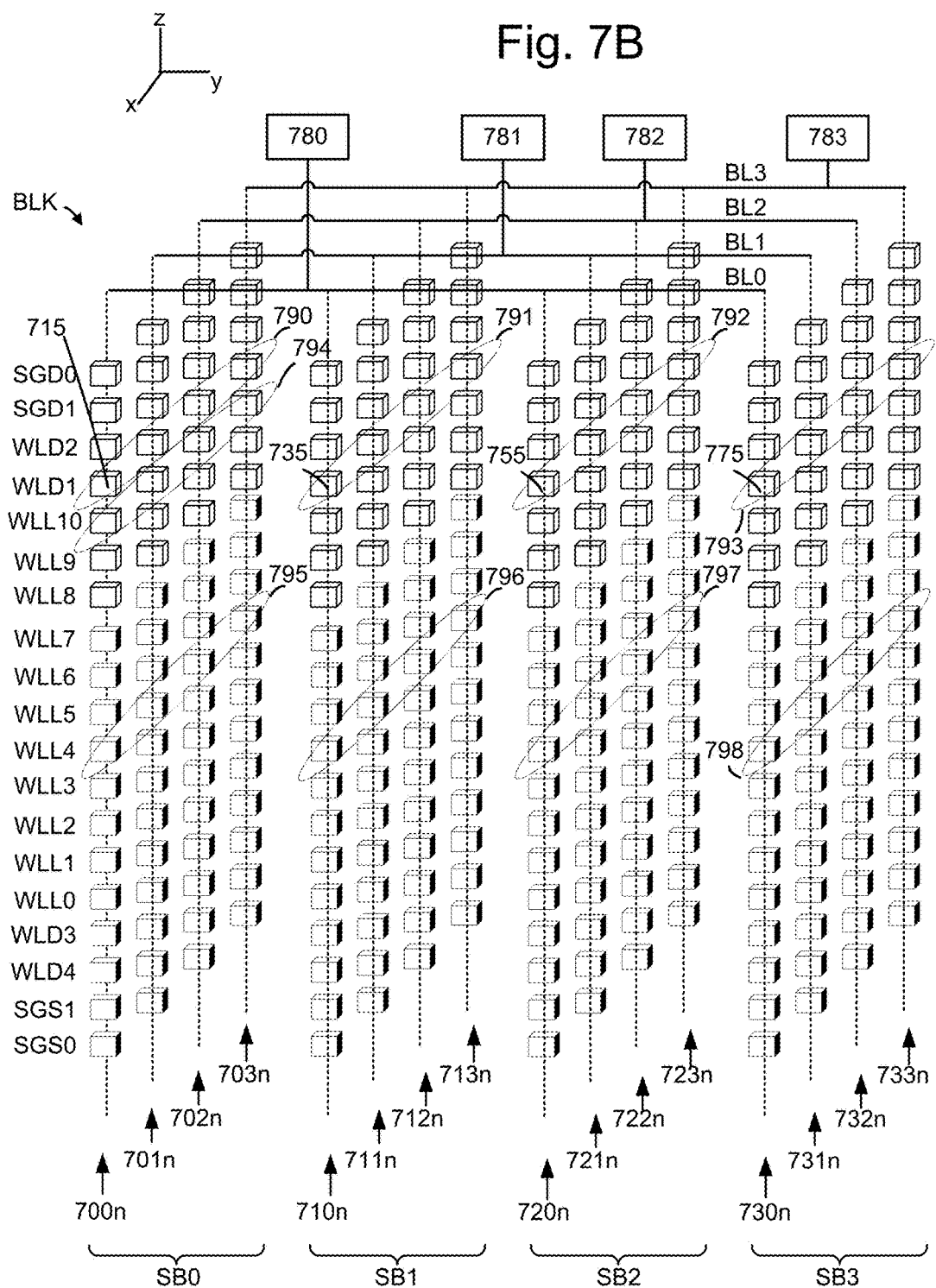
FIG. 7B depicts additional detail of the sub-blocks SB0-SB3 of FIG. 8A.

FIG. 7B depicts additional detail of the sub-blocks SB0-SB3 of FIG. 7A. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3.

As described herein, sets of dummy memory cells may be evaluated to assess the health of a set of data memory cells. In some cases, multiple dummy memory cells are provided at an end of a string of data memory cells. In this example, there are two dummy memory cells at both the drain and source ends of each string. Generally, the dummy memory cell which is adjacent to an edge data memory cell is more indicative of the health of the data memory cells than other dummy memory cells which are further from the data memory cells. This is because the adjacent dummy memory cell experiences more stress, e.g., due lateral field effects, due to its proximity to a data memory cell. However, a dummy memory cell which is not adjacent to an edge data memory cell can also indicate the health of the data memory cells.

The dummy memory cells are arranged in sets in each sub-block. For example, the set 790 represents the dummy memory cells in SB0 which are connected to WLD1. The dummy memory cells in this set have their control gates connected to a common control line. The sets 791, 792 and 793 represent the dummy memory cells in SB1, SB2 and SB3, respectively, which are connected to WLD1. The dummy memory cells 715, 735, 755 and 775 of FIG. 7A are in the sets 790, 791, 792 and 793, respectively. The data memory cells are also arranged in sets in each sub-block. For example, the set 794 comprises data memory cells in SB0 connected to WLL10. These are drain side edge memory cells at a drain side of the strings 700n, 701n, 702n and 703n. The set 795 comprises data memory cells in SB0 connected to WLL4. These are not edge memory cells, but are mid-range along the strings 700n, 701n, 702n and 703n. Similarly, the sets 796, 797 and 798 comprise data memory cells in SB1, SB2 and SB3 connected to WLL4. Thus, when WLL4 is a selected word line, a selected set of data memory cells which are connected to a selected word line comprises sets 795-798. Each cell in any of the sets 795-798 can be read concurrently via the respective bit lines, for instance.

Figure 8A:
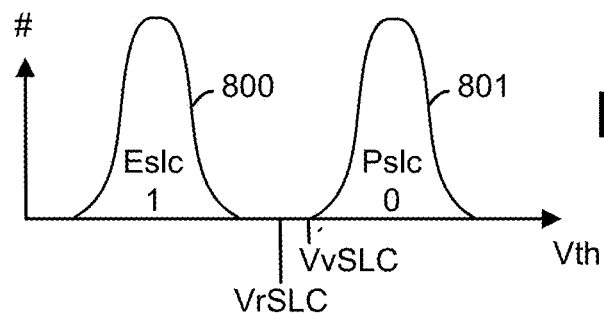
FIG. 8A depicts example Vth distributions of memory cells, where two data states are used.

FIG. 8A depicts example Vth distributions of memory cells, where two data states are used. During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

The Vth distributions 800 and 801 represent an erased state (Eslc) and a programmed data state (Pslc), respectively. Further, assume in this example that the cells have remained in the second read situation since the programming has completed so that the Vth distributions have not been shifted.

The erased state may represent a one bit while the programmed state represents a zero bit, for example. A verify voltage for the programmed state is VvSLC and a read voltage for distinguishing between the two states is VrSLC. Generally, a read voltage for distinguishing between adjacent states, e.g., a lower state and a higher state, should be located midway between the upper tail of the Vth distribution of the lower state and the lower tail of the Vth distribution of the higher state.

Figure 8B:
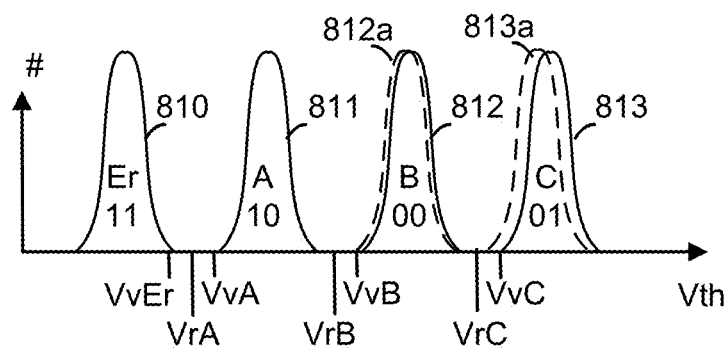
FIG. 8B depicts example Vth distributions of memory cells, where four data states are used.

FIG. 8B depicts example Vth distributions of memory cells, where four data states are used. The data states are represented by Vth distributions 810, 811, 812 and 813 for the Er, A, B and C states, respectively, and an example encoding of bits for each state is 11, 10, 00 and 01, respectively, in the format of upper page (UP) bit/lower page (LP) bit. The verify voltages are VvA, VvB and VvC, and the read voltages are VrA, VrB and VrC. A LP read may use VrA and VrC and an UP read may use VrB.

The Vth distributions 812a and 813a (dashed lines) for the B and C states, respectively, represent a Vth downshift which occurs when the cells have a reduced endurance. The downshift occurs after the cells are programmed. This example shows that the downshift occurs mainly on the higher data states. In one approach, the higher states include the top half of the programmed states and the lower states include the bottom half of the programmed states. Moreover, the Vth downshift for a set of memory cells may be larger when the cells are at the edge of a set of cells. See FIGS. 10C and 10D.

An erase-verify voltage, VvEr, may be used in an erase operation. See also FIG. 11E.

Figure 8C:
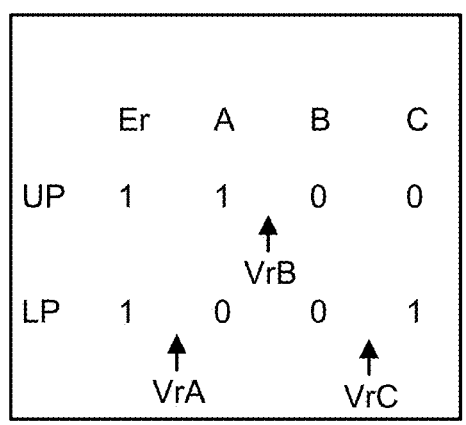
FIG. 8C depicts example bit sequences for lower and upper pages of data, and associated read voltages, for the Vth distributions of FIG. 8B.

FIG. 8C depicts example bit sequences for lower and upper pages of data, and associated read voltages, for the Vth distributions of FIG. 8B. An example encoding of bits for each state is 11, 10, 00 and 01, respectively, in the format of upper page (UP) bit/lower page (LP) bit. A LP read may use VrA and VrC and an UP read may use VrB. A lower or upper bit can represent data of a lower or upper page, respectively. Three programmed data states A, B and C are used in addition to the erased state, Er. With these bit sequences, the data of the lower page can be determined by reading the memory cells using read voltages of VrA and VrC. The lower page (LP) bit=1 if Vth<=VrA or Vth>VrC. LP=0 if VrA<Vth<=VrC. The upper page (UP) bit=1 if Vth<=VrB and LP=0 if Vth>VrB. In this case, the UP is an example of a page which can be determined by reading using one read voltage applied to a selected word line. The UP is an example of a page which can be determined by reading using two read voltages applied to a selected word line.

FIG. 8D depicts example Vth distributions of memory cells, where eight data states are used, and a downshift in Vth is observed for memory cells in an unselected block. For the Er, A, B, C, D, E, F and G states, we have Vth distributions 820, 821, 822, 823, 824, 825, 826 and 827, respectively. For the A, B, C, D, E, F and G states, we have verify voltages VvA, VvB, VvC, VvD, VvE, VvF and VvG, respectively, and read voltages VrA, VrB, VrC, VrD, VrE, VrF and VrG, respectively, and example encoding of bits of 111, 110, 100, 000, 010, 011, 001 and 101, respectively. The bit format is: UP/MP/LP.

The Vth distributions 825a, 826a and 827a (dashed lines) for the E, F and G states, respectively, represent a Vth downshift which occurs when the cells have a reduced endurance. This example shows that the downshift occurs mainly on the higher data states.

FIG. 8E depicts bit sequences for lower, middle and upper pages of data, and associated read voltages, for the Vth distributions of FIG. 8D. In this case, the memory cells each store three bits of data in one of eight data states. Example bit assignments for each state are depicted. A lower, middle or upper bit can represent data of a lower, middle or upper page, respectively. Seven programmed data states A, B, C, D, E, F and G are used in addition to the erased state, Er. With these bit sequences, the data of the lower page can be determined by reading the memory cells using read voltages (e.g., control gate or word line voltages) of VrA and VrE. The lower page (LP) bit=1 if Vth<=VrA or Vth>VrE. LP=0 if VrA<Vth<=VrE. Generally, a memory cell can be sensed by sense circuitry while a read voltage is applied. If the memory cell is in a conductive state, its threshold voltage (Vth) is less than the read voltage. If the memory cell is in a non-conductive state, its Vth is greater than the read voltage.

The read voltages which are used to read a page of data are determined by transitions from 0 to 1 or 1 to 0 in the encoded bits (code word) for each state. For example, the LP bit transitions from 1 to 0 between Er and A, and from 0 to 1 between D and E. Accordingly, the read voltages for the LP are VrA and VrE.

The data of the middle page can be determined by reading the memory cells using read voltages VrB, VrD and VrF. The middle page (MP) bit=1 if Vth<=VrB or VrD<Vth<=VrF. MP=0 if VrB<Vth<=VrD or Vth>VrF. For example, the MP bit transitions from 1 to 0 between A and B, from 0 to 1 between C and D, and from 1 to between E and F. Accordingly, the read voltages for the MP are VrB, VrD and VrF.

The data of the upper page can be determined by reading the memory cells using read voltages of VrC and VrG. The upper page (UP) bit=1 if Vth<=VrC or Vth>VrG. UP=0 if VrC<Vth<=VrG. For example, the UP bit transitions from 1 to 0 between B and C, and from 0 to 1 between F and G. Accordingly, the read voltages for the UP are VrC and VrG. See also FIG. 17C2, which describes read errors for different pages of data.

FIG. 9 depicts a waveform of an example programming operation. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages such as discussed in connection with FIGS. 8A, 8B and 8D.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation. The initial program voltage has a magnitude of Vpgm_initial. As discussed further below, this voltage can be adjusted lower to a reduced level of e.g., Vpgm_initial_r, when a set of cells has a reduced endurance. The subsequent program voltages can also be set lower.

The waveform 900 includes a series of program voltages 901, 902, 903, 904, 905, . . . 906 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 910) may be applied after each of the program voltages 901 and 902. A-, B- and C-state verify voltages of VvA, VvB and VvC (waveform 911) may be applied after each of the program voltages 903 and 904. After several additional program loops, not shown, E-, F- and G-state verify voltages of VvE, VvF and VvG (waveform 912) may be applied after the final program voltage 906.

Figure 12A:
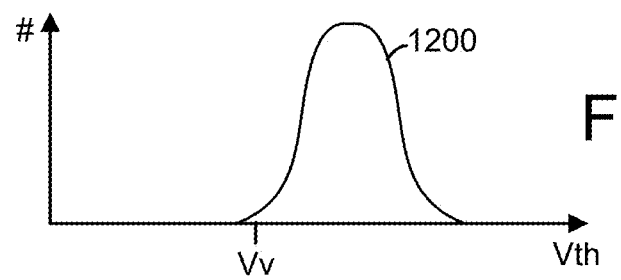
FIG. 12A depicts an example Vth distribution of a set of dummy memory cells for a fresh memory device, after the dummy memory cells are programmed.

A similar waveform can be applied to the dummy memory cells to program them to a desired Vth level, such as depicted in FIG. 12A.

FIG. 10A depicts read voltages and pass voltages in an example read operation, where lower, middle and upper pages are read separately. Vpass is ramped up and then back down separately during the read voltages of each of the lower, middle and upper pages as depicted by plots 1005, 1010 and 1015, respectively. This example is for an eight-state memory device. The example can be modified for fewer states (e.g., four states and two pages) or additional states (e.g., sixteen states and four pages).

In a first portion of the read operation, the A and E states are read using a read voltage waveform 1000 while the pass voltage waveform (plot 1005) is applied. Sensing of the A and E states occurs at t1 and t2, respectively. In a second portion second portion of the read operation, the B, D and F states are read using a read voltage waveform (plot 1010) while the pass voltage waveform (plot 1015) is applied. Sensing of the B, D and F states occurs at t3, t4 and t5. In a third portion of the read operation, the C and G states are read using a read voltage waveform 1020 while the pass voltage waveform 1025 is applied. Sensing of the C and G states occurs at t6 and t7, respectively.

Figure 10B:
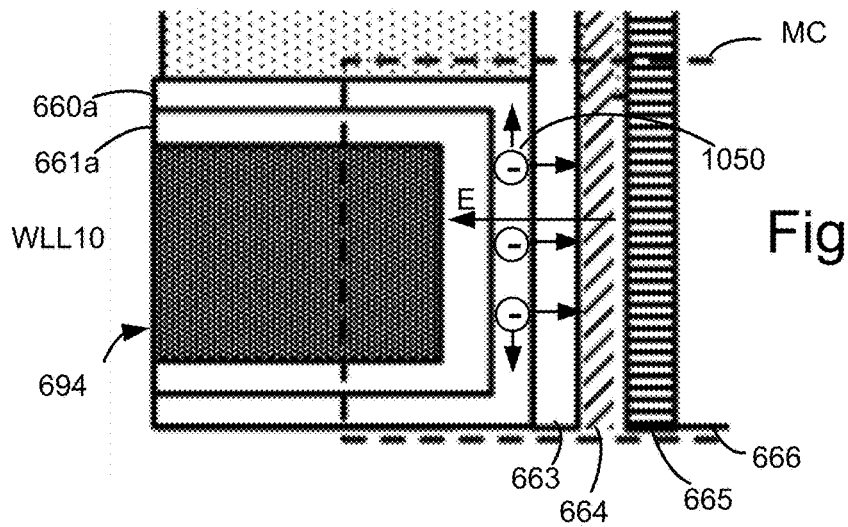
FIG. 10B depicts a portion of the memory cell MC of FIG. 6 showing electrons moving out of a charge trapping region.

FIG. 10B depicts a portion of the memory cell MC of FIG. 6 showing electrons moving out of a charge trapping region. The memory cell includes a control gate 694, a metal barrier 661a, a blocking oxide 660a, a charge-trapping layer 663, a tunneling layer 664, a channel 665 and a dielectric core 666. An electric field (E) is created which repels electrons (see example electron 1050) from the charge trapping layer, decreasing the Vth. The electrons may move toward the channel as well as laterally, toward adjacent cells.

The techniques described herein are applicable to memory cells with any type of charge storage material including charge trapping memory cells and floating gate memory cells.

Figure 10C:
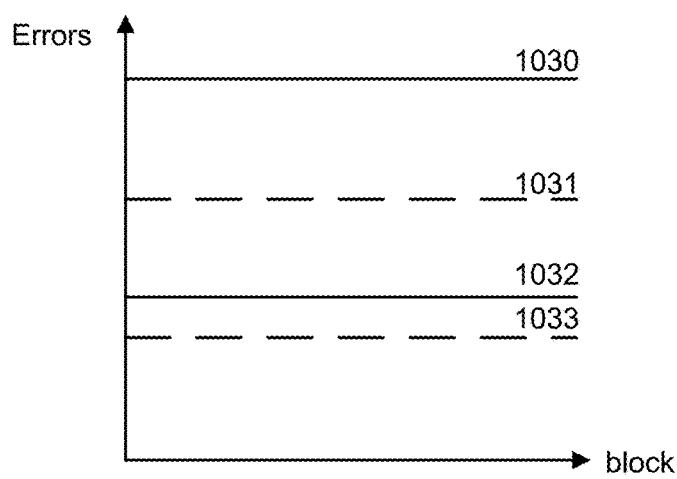
FIG. 10C depicts a plot of errors versus block, including drain and source edge word lines in a good block, and drain and source edge word lines in a bad block.

FIG. 10C depicts a plot of errors versus block, including drain and source edge word lines in a good block, and drain and source edge word lines in a bad block. The number of errors in a read operation varies for different blocks. Generally, the errors are greater for memory cells on an edge word line than on other word lines. Further, the errors are typically greater for memory cells on a drain edge word line than on a source edge word line. In FIGS. 5 and 7A, WLL0 is an example of a source edge word line and WLL10 is an example of a drain edge word line. The errors vary across all of the blocks but an average is shown. Further, the blocks can be separated into good blocks, which do not have a significant reduction in endurance, and bad blocks, which do have a significant reduction in endurance. For example, the highest number of errors is for memory cells connected to a drain edge word line in a bad block as indicated by plot 1030. The second highest number of errors is for memory cells connected to a source edge word line in a bad block as indicated by plot 1031. The number of errors for memory cells connected to a mid-range word line, between the edge word lines, is less than for the memory cells connected to the edge word line.

The third highest number of errors is for memory cells connected to a drain edge word line in a good block as indicated by plot 1032. The fourth highest number of errors is for memory cells connected to a source edge word line in a good block as indicated by plot 1033.

Figure 10D:
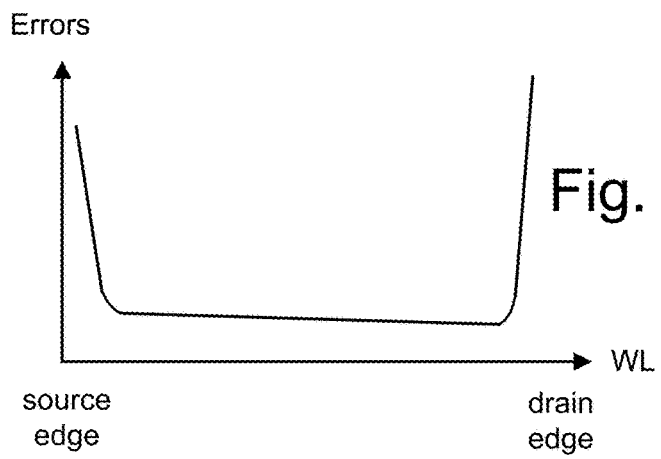
FIG. 10D depicts a plot of errors versus word line position.

FIG. 10D depicts a plot of errors versus word line position. As mentioned, the number of errors is generally higher for memory cells of the source edge and drain edge word lines than for memory cells of the mid-range word lines. One factor is a channel gradient which is present in a string between an edge data memory cell and an adjacent dummy memory cell. The channel gradient can generate electrons which cause inadvertent programming of cells connected to the edge word lines. Another factors is a difference in Vth between the edge data memory cells and the adjacent dummy memory cells which causes electrons to move away from the edge data memory cells, as in FIG. 10B. The effects of word line position are also seen as the memory device accumulates additional P-E cycles and becomes degraded.

Figure 10E:
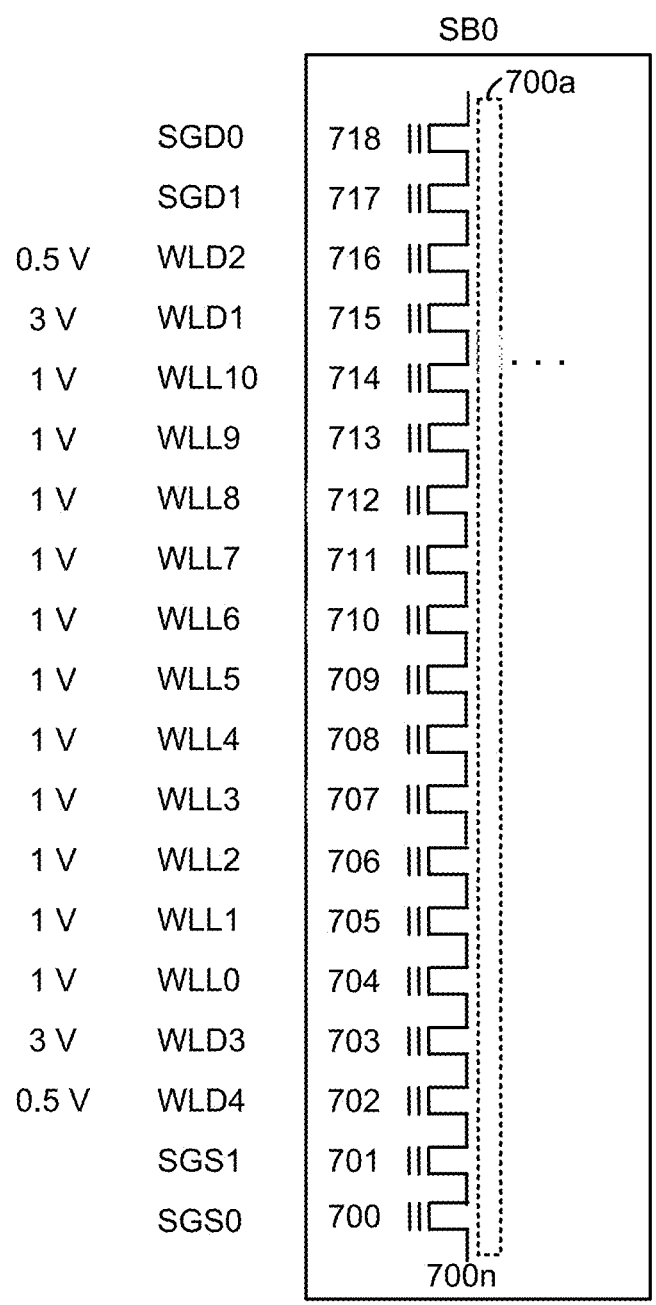
FIG. 10E depicts example voltages applied to dummy memory cells and data memory cells in the NAND string 700n of FIG. 7A in an erase operation.

FIG. 10E depicts example voltages applied to dummy memory cells and data memory cells in the NAND string 700n of FIG. 7A in an erase operation. During an erase voltage, the data word lines WLL0-WLL10 receive 1 V, the dummy word lines WLD1 and WLD3 receive 3 V and the dummy word lines WLD2 and WLD4 receive 0.5 V, for instance. As mentioned, the number of erase loops for the data memory cells tends to increase after P-E cycles are accumulated. Additionally, the memory cells of the dummy word lines (WLD1 and WLD3) which are adjacent to the edge data word lines (WLL10 and WLL0) tend to be weakly erased during each erase operation. As the number of erase loops for the data memory cells increases, these dummy memory cells will be erased more deeply than would be the case in the absence of degradation. This further degrades the data retention of the data memory cells of the edge word lines due to more lateral charge diffusion from these memory cells. The lateral charge diffusion, or movement of electrons out of the charge storing region as depicted in FIG. 10B, is a function of an amount by which the Vth of an edge data memory cell exceeds the Vth of the adjacent dummy memory cell. This difference is greater when the edge data memory cell is programmed to a higher data state, and when the adjacent dummy memory cell is more deeply erased.

Even if the dummy cells were periodically programmed to reverse the Vth downshift caused by the weak erase, the degraded endurance and data retention characteristics of the data memory cells generally cannot be recovered.

Figure 11A:
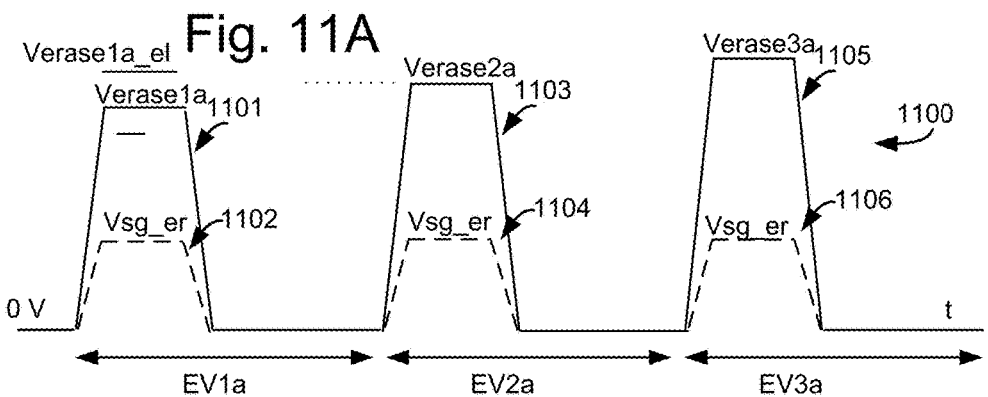
FIG. 11A depicts example voltages in an erase operation which uses gate-induced drain leakage (GIDL) to charge up the channel of a NAND string.

FIG. 11A depicts example voltages in an erase operation which uses gate-induced drain leakage (GIDL) to charge up the channel of a NAND string. An erase operation generally involves charging a channel of a string of memory cells while applying a control gate voltage to the memory cells which results in a positive channel-to-gate voltage. This drives electrons out of the charge-trapping layer, lowering the Vth of the cells. The cells transition from the programmed data states to the erased state. This approach can be used, e.g., in erasing cells in the three-dimensional device of FIG. 4. The vertical axis depicts voltage and the horizontal axis depicts time. The waveform 1100 depicts a series of bit line and/or source line voltages 1101, 1103 and 1105 with magnitudes of Verase1a, Verase2a and Verase3a, respectively, which step up in each erase-verify iteration.

The initial erase voltage has a magnitude of Verase1a. As discussed, this voltage can be adjusted higher to an elevated level of, e.g., Verase1a_el, when a set of cells has a reduced endurance. The subsequent erase voltages can also be set higher.

The waveform also depicts select gate voltages 1102, 1104 and 1106 with a common magnitude of Vsg_er, in one approach. In another approach, the select gate voltage also steps up with the bit line and/or source line voltage. The waveform provides a number of erase-verify loops EV1a, EV2a and EV3a, each of which includes an erase portion and a verify portion (verify test). The channel of a NAND string can be charged up in an erase operation based on GIDL, which is generated in proportion to the drain-to-gate voltage of the select gate transistors at the drain-end and/or source-end of the NAND sting. In another option, the erase voltage steps up to its peak in two steps instead of one to allow time for the charge up of the channel to occur. In another option, the erase voltage and the select gate voltage both step up to their peaks in two steps.

Figure 11B:
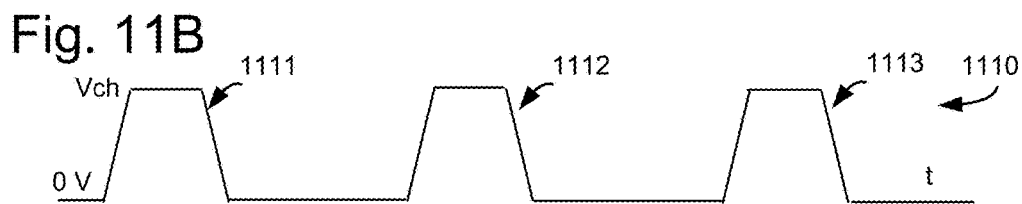
FIG. 11B depicts an example channel voltage consistent with FIG. 11A.

FIG. 11B depicts an example channel voltage consistent with FIG. 11A. The channel voltage (Vch) in represented by a waveform 1110 which has elevated portions 1111, 1112 and 1113 coincident with the elevated voltages of FIG. 11A. In the approach of FIGS. 11A and 11B, the word line (control gate) voltage is at a level, e.g., 0-1 V, which provides a positive channel-to-gate voltage. The channel voltage is significantly higher than the word line voltage. A deeper or stronger erase can be provided by lowering the control gate voltage and thereby increasing the channel-to-gate voltage.

Figure 11C:
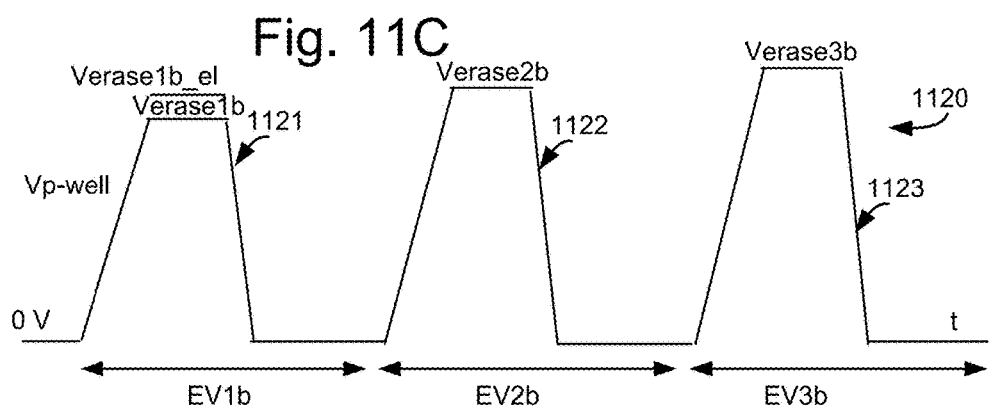
FIG. 11C depicts example erase voltages in an erase operation which applies a positive voltage to a p-well of a substrate.

FIG. 11C depicts example erase voltages in an erase operation which applies a positive voltage to a p-well of a substrate. This approach is particularly suitable for a 2D memory device. The waveform 1120 comprises voltage pulses 1121, 1122 and 1123 with amplitudes of Verase1*b*, Verase2*b* and Verase3*b*, respectively, which can step up in each loop. The voltage pulses are in erase-verify loops EV1*b*, EV2*b* and EV3*b*. The word line voltage may be at a level, e.g., 0 V or close to 0 V, which provides a positive channel-to-gate voltage.

The initial erase voltage has a magnitude of Verase1*b*. As discussed further below, this voltage can be adjusted higher to an elevated level of e.g., Verase1*b*_el, when a set of cells has a reduced endurance. The subsequent erase voltages can also be set higher.

Figure 11D:
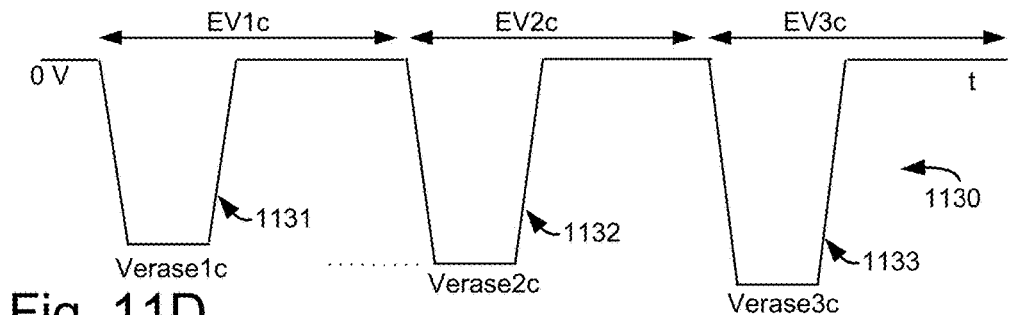
FIG. 11D depicts example erase voltages in an erase operation which applies a negative voltage to the word lines in a block.

FIG. 11D depicts example erase voltages in an erase operation which applies a negative voltage to the word lines in a block. In this approach, the memory device has the capability to apply a negative voltage on the word lines, such as by using a negative charge pump. In one approach, the drain (bit line) and source can be set at 0 V, and there is a positive source-to-control gate voltage of the memory cells. The waveform 1130 depicts a series of negative control gate voltages 1131, 1132 and 1133 with magnitudes of Verase1*c*, Verase2*c* and Verase3*c*, respectively, in erase-verify loops EV1*c*, EV2*c* and EV3*c*, respectively.

Figure 11E:
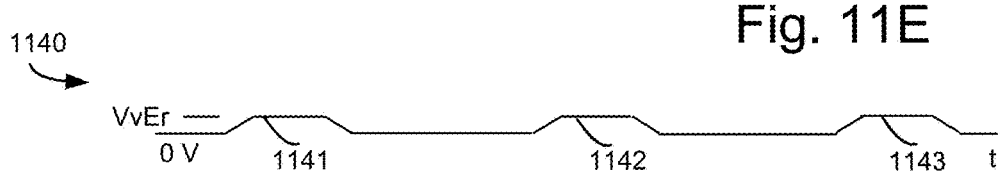
FIG. 11E depicts example verify voltages in an erase operation.

FIG. 11E depicts example verify voltages in an erase operation. FIG. 11E is time aligned with FIG. 11A to 11D and can be used with any of these waveforms to provide the verify test of an erase-verify loop. The waveform 1140 includes voltage pulses 1141, 1142 and 1143 at VvEr which are applied to the word lines during a verify test of an erase operation. The erase-verify voltages can be small positive values, 0 V, or negative values.

Figure 12B:
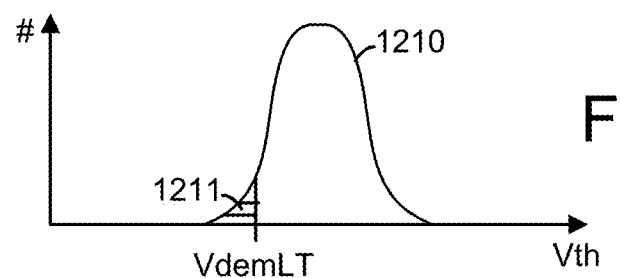
FIG. 12B depicts a demarcation voltage which is used to measure a lower tail of the Vth distribution of a set of dummy memory cells.
Figure 12C:
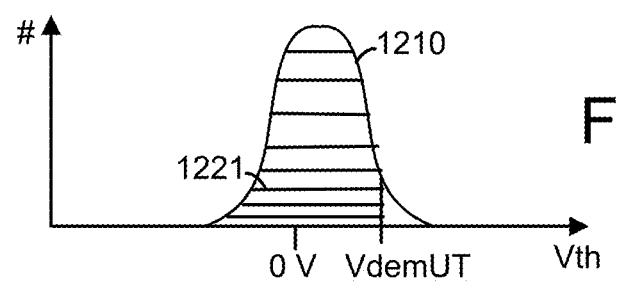
FIG. 12C depicts a demarcation voltage which is used to measure an upper tail of the Vth distribution of a set of dummy memory cells.

In FIG. 12A to 12C, the vertical axis depicts a number of dummy memory cells and the horizontal axis depicts a Vth of the dummy memory cells. The horizontal axes are aligned with one another.

FIG. 12A depicts an example Vth distribution 1200 of a set of dummy memory cells for a fresh memory device, after the dummy memory cells are programmed. In one approach, the dummy memory cells are programmed using a verify level of Vv after the memory device is fabricated. The dummy memory cell does not store data but the Vth is provided at a desired level which may be similar to the Vth of a lower data state. The Vth level allows the dummy memory cells to be set in a conductive state when the control gate voltage is sufficiently high and in a non-conductive state when the control gate voltage is sufficiently low, e.g., 0 V.

The dummy memory cells may be erased and re-programmed during the use of the memory device in some cases.

FIG. 12B depicts a demarcation voltage which is used to measure a lower tail of the Vth distribution 1210 of a set of dummy memory cells. The Vth distribution has shifted down relative to the distribution in FIG. 12A for a fresh memory device. In connection with an evaluation, a sensing operation for the dummy memory cells may be performed in which a lower tail demarcation voltage, VdemLT, is applied to a set of dummy memory cells while the conductive state of each dummy memory cell is sensed. The degree of downshift of the dummy memory cells is indicated by the number of dummy memory cells with a Vth<VdemLT. This number is represented by the region 1211 of the Vth distribution.

FIG. 12C depicts a demarcation voltage which is used to measure an upper tail of the Vth distribution 1210 of a set of dummy memory cells. The Vth distribution is the same as in FIG. 12B. As an alternative, in connection with an evaluation, a sensing operation for the dummy memory cells may be performed in which an upper tail demarcation voltage, VdemUT, is applied to the set of dummy memory cells while the conductive state of each dummy memory cell is sensed. The degree of downshift of the dummy memory cells is indicated by the number of dummy memory cells with a Vth<VdemUT. This number is represented by the region 1221 of the Vth distribution. The loss of endurance is proportional to the downshift. The degree of downshift of the dummy memory cells is also inversely proportional to the number of dummy memory cells with a Vth<VdemLT or Vth<VdemUT.

One advantage to using the higher demarcation voltage, VdemUT>VdemLT, is that a lower tail of the Vth distribution may be below 0 V. As a result, a VdemLT<0 V might be needed. However, providing a negative voltage on the chip can be problematic. A demarcation voltage in the upper tail of the Vth distribution is more likely to be at or above 0 V and therefore easier to supply on the chip.

FIG. 13A depicts an example process for evaluating dummy memory cells to determine whether to take a corrective action for associated data memory cells. Step 1300 includes selecting a set of cells to evaluate, such as a block or sub-block of cells. Step 1301 includes evaluating threshold voltages of dummy memory cells in the set of cells by sensing them using a demarcation voltage, Vdem (e.g., VdemLT or VdemUT). This evaluation can be triggered in response to various factors. For example, the evaluation may occur when the number of P-E cycles reaches a threshold, e.g., every 100 cycles. This is done because degradation of the memory cells increases with P-E cycles. The evaluation may also occur in response to a read, program or erase command. This allows a corrective action to be taken before the read, program or erase operation. Degradation may also be indicated when an error count from a previous read operation involving the set of cells exceeds a threshold. An evaluation may be appropriate at this time as well. The evaluation indicates a number of the dummy memory cells which have a Vth<Vdem.

As mentioned, the evaluation does not interfere with the operation of the data memory cells and can occur at any time independent of the status of the data memory cells. For example, the data memory cells may be in a long term storage mode in which regular reading and programming does not occur for a long time, e.g., months. The dummy memory cells can be evaluated without interfering with this mode. In contrast, measuring endurance based on the number of erase loops in an erase operation would require the data memory cells to be erased. In another example, a first block may be partially programmed after which operations are performed on other blocks. The programming of the first block may then resume using the next available word line. The evaluation can occur at this time without the need to erase the previously programmed data.

In the example of FIG. 7B, the sets 790, 791, 792 and 793 of dummy memory cells may be sensed one set at a time. All dummy cells in a set may be sensed concurrently via their respective bit lines, in one approach.

A decision step 1302 determines whether the number of dummy memory cells which have a Vth<Vdem is more than a specified number N. If this is true, step 1303 performs a corrective action for the associated data memory cells. For example, step 1304 includes marking the data memory cells as having a reduced endurance and step 1305 includes adjusting voltages for the data memory cells such as by providing lower read voltages in a next or other future read operation, a lower initial program voltage in a next or other future programming operation, and a higher initial erase voltage in a next or other future erase operation. A lower read voltage, at least for one or more higher states including a highest programmed data state, results in a more accurate read operation because it accounts for the Vth downshift of the data memory cells, as shown in FIGS. 8B and 8D. A lower initial program voltage results in a more accurate program operation because it compensates for an increased programming speed which is associated with reduced endurance. If the programming speed is too high, the Vth distributions become wider than is optimal. A higher initial erase voltage results in a more accurate erase operation because it accounts for a decreased erase speed which is associated with reduced endurance.

Step 1305 may consider the WL position. For example, the adjustment in voltages may be made for edge word lines but not mid-range word lines. Or, a larger adjustment may be made in voltages for edge word lines compared to mid-range word lines.

In another example of a corrective action, step 1306 includes marking a set of cells as being bad and recovering data in the set of cells. The marking can involve saving information in registers. The information can be saved in the example storage region 113 of FIG. 1. The marking can include setting a flag. One approach of a recovery read operation is to perform multiple reads for each data state while shifting the read voltage higher and/or lower than the default level. The read result which results in the least number of errors is then used. The data which is read can be stored in another location such as another block.

If a program command has been issued, the evaluation may indicate that the endurance loss in the memory device is so significant that data should not be written to the set of memory cells. Instead, in the corrective action of step 1306, the controller can identify another set of memory cells in which to write the data.

If decision step 1302 is false, a decision step 1307 determines if there is a next set of cells to evaluate. If this is true, step 1300 is reached and a next set of cells is selected to evaluate. If decision step 1307 is false, a step 1308 may be used to adjust the number N of decision step 1302 and the process is done at step 1309. N can be adjusted dynamically based on an evaluation of a number of sets of memory cells. For instance, N can be adjusted such that a specified portion, e.g., 5% of the sets of memory cells are considered to have reduced endurance and are therefore subject to a corrective action. In another approach, N is fixed and is determined from testing, for instance. The demarcation voltage could also be adjusted to cause a specified portion of the sets of memory cells to be subject to a corrective action. One or more corrective actions can be performed.

In one approach, the evaluation and corrective action are applied on a per-sub-block basis. Thus, each sub-block can have its own evaluation and corrective action. In another approach, the evaluation and corrective action are applied on a per-block basis. Thus, each block can have its own evaluation and corrective action.

Figure 13B:
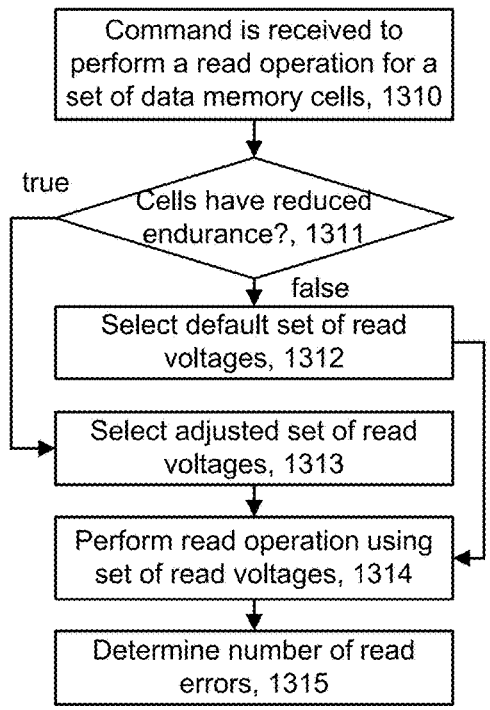
FIG. 13B depicts a process for adjusting read voltages as an example of a corrective action consistent with step 1305 of FIG. 13A.

FIG. 13B depicts a process for adjusting read voltages as an example of a corrective action consistent with step 1305 of FIG. 13A. At step 1310, a command is received to perform a read operation for a set of data memory cells, e.g., which are connected to a selected word line. For example, a page of data may be read. A decision step 1311 determines if the cells have a reduced endurance, e.g., by determining if a flag or other information is set such as discussed in connection with step 1304 of FIG. 13A. If the decision step is true, step 1313 selects an adjusted set of read voltages, e.g., in which the read voltages are lowered, at least for a highest data state. Step 1314 performs the read operation using the set of read voltages. Step 1315 optionally determines the number of read errors. If decision step 1311 is false, step 1312 selects a default set of read voltages. By adjusting the read voltages lower, the number of read errors can be reduced.

Figure 13C:
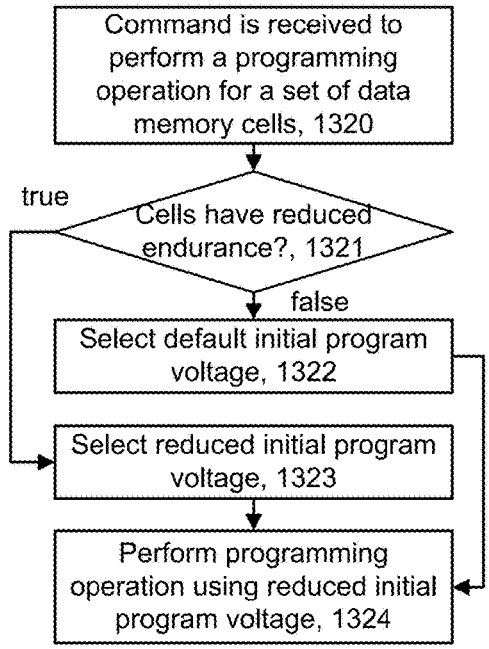
FIG. 13C depicts a process for adjusting an initial program voltage as an example of a corrective action consistent with step 1305 of FIG. 13A.

FIG. 13C depicts a process for adjusting an initial program voltage as an example of a corrective action consistent with step 1305 of FIG. 13A. At step 1320, a command is received to perform a programming operation for a set of data memory cells, e.g., which are connected to a selected word line. For example, a page of data may be programmed. A decision step 1321 determines if the cells have a reduced endurance. If the decision step is true, step 1323 selects a reduced initial program voltage. Step 1324 performs the programming operation using the reduced initial program voltage. If decision step 1321 is false, step 1322 selects a default initial program voltage. By using a reduced initial program voltage, an excessively high programming speed is avoided which would result in wider Vth distributions.

In an example implementation, a control circuit, to perform a corrective action, is configured to use a lower initial program voltage in a next programming operation for one set of memory cells compared to an initial program voltage used in a past programming operation for the one set of memory cells.

Figure 13D:
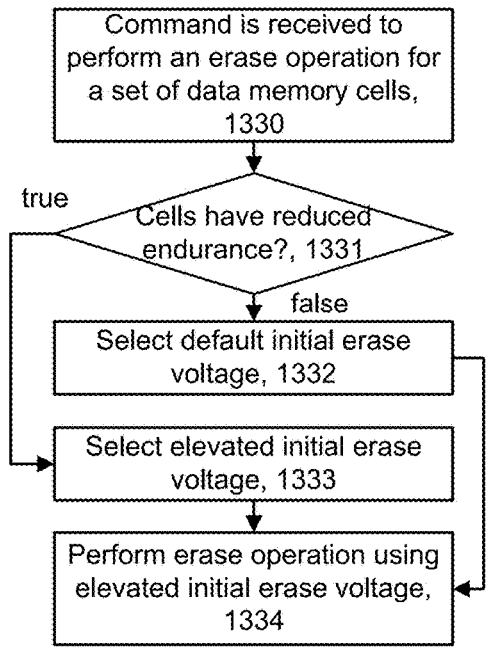
FIG. 13D depicts a process for adjusting an initial erase voltage as an example of a corrective action consistent with step 1305 of FIG. 13A.

FIG. 13D depicts a process for adjusting an initial erase voltage as an example of a corrective action consistent with step 1305 of FIG. 13A. At step 1330, a command is received to perform an erase operation for a set of data memory cells, e.g., in a block. A decision step 1331 determines if the cells have a reduced endurance. If the decision step is true, step 1333 selects an elevated initial erase voltage. Step 1334 performs the erase operation using the elevated initial erase voltage. If decision step 1331 is false, step 1332 selects a default initial erase voltage. By using an elevated initial erase voltage, an excessively slow erase speed is avoided which would result in excessive erase loops and increased degradation.

In an example implementation, a control circuit, to perform a corrective action, is configured to use a higher initial erase voltage in a next erase operation for the one set of memory cells compared to an initial erase voltage used in a past erasing operation for the one set of memory cells.

Figure 14:
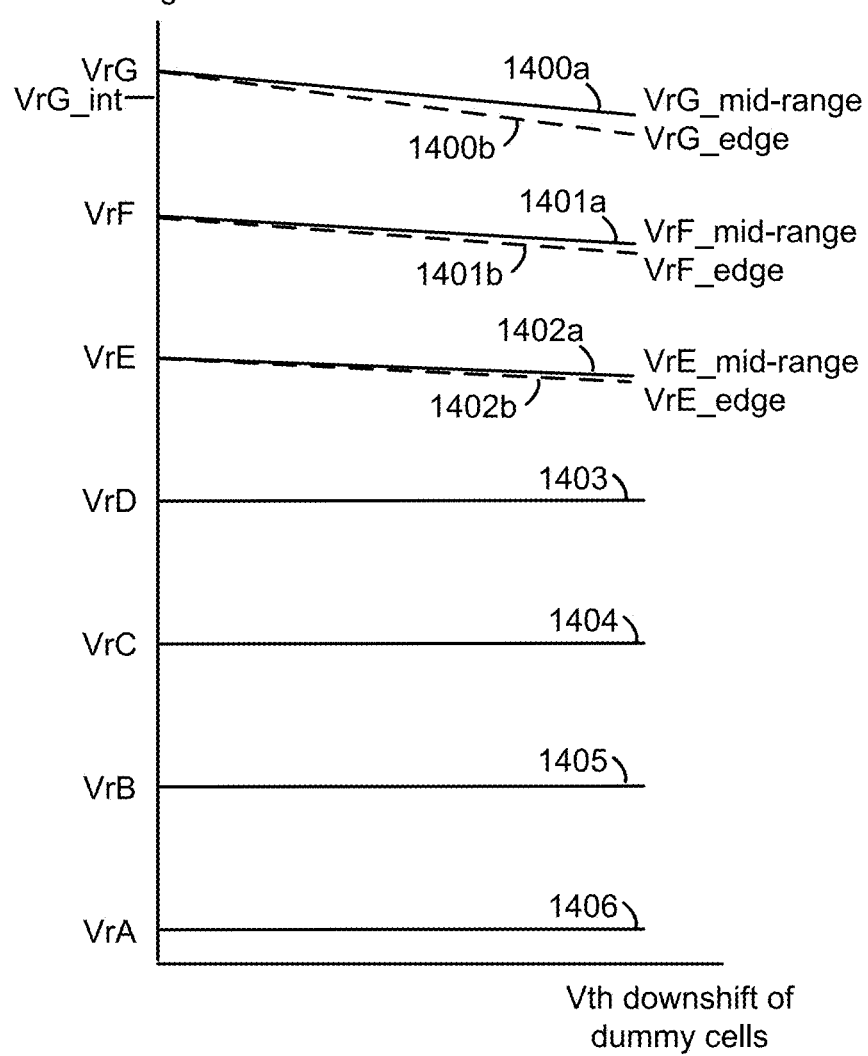
FIG. 14 depicts a plot of read voltage versus Vth downshift for different data states and word lines.

FIG. 14 depicts a plot of read voltage versus Vth downshift of dummy memory cells. As mentioned, the read voltages can be reduced at least for the highest data state and perhaps for a number of higher data states which includes the highest data state. This is done for a set of data memory cells which are determined to have a reduced endurance. This example is consistent with FIG. 8D, which shows that the highest three data states, E, F and G, experience a significant Vth downshift due to endurance loss while the remaining state do not. Accordingly, a reduced read voltage is optimal for these higher data state. Further, as mentioned, the data memory cells of the edge word lines are more affected by endurance loss than the data memory cells of the mid-range word lines. Accordingly, the read voltage can also be adjusted based on the word line position.

Plots 1400*a* and 1400*b* shows a variation in VrG for a mid-range word line and an edge word line, respectively. The read voltage can be lower for an edge word line than for a mid-range word line. VrG_mid-range and VrG_edge represent the G state read voltage for a mid-range word line or edge word line, respectively, with reduced endurance.

Plots 1401a and 1401b shows a variation in VrF for a mid-range word line and an edge word line, respectively. VrF_mid-range and VrF_edge represent the F state read voltage for a mid-range word line or edge word line, respectively, with reduced endurance.

Plots 1402a and 1402b shows a variation in VrE for a mid-range word line and an edge word line, respectively. VrE_mid-range and VrE_edge represent the E state read voltage for a mid-range word line or edge word line, respectively, with reduced endurance.

Plots 1403, 1404, 1405 and 1406 represent fixed read voltages for the D, C, B and A states in this example. To provide a simplified implementation, either the default read voltages at the left side of each plot or the read voltages at the right side of the plots, including the reduced read voltages at the right side of the plots for the E, F and G states, can be used. A more complex implementation could interpolate to provide the read voltages based on the amount of Vth downshift, which may be represented by the number of dummy cells with Vth<Vdem in step 1302 of FIG. 13A. For example, for the G state cells connected to a mid-range word line, a read voltage between VrG and VrG_mid-range, e.g., VrG_int, could be provided. VrG_int could also be used for an edge word line.

Figure 15A:
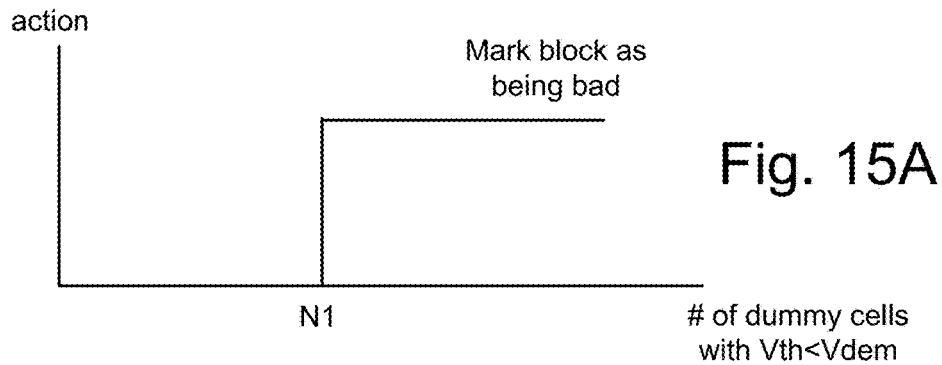
FIG. 15A depicts a plot of a corrective action versus a number of dummy cells with Vth<Vdem.

FIG. 15A depicts a plot of a corrective action versus a number of dummy cells with Vth<Vdem. In this approach, a single corrective action is to mark a block, or other set of cells, as being bad, when at least a number N1 of the dummy cells have Vth<Vdem. These can be called low-Vth dummy memory cells.

Figure 15B:
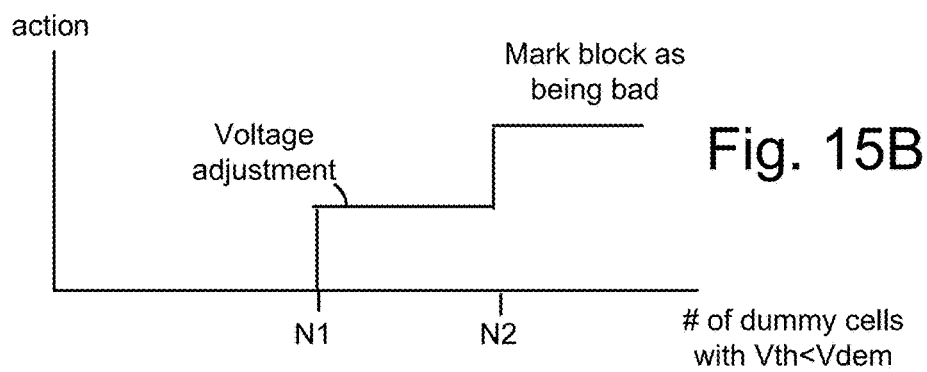
FIG. 15B depicts a plot of multiple corrective actions versus a number of dummy cells with Vth<Vdem.

FIG. 15B depicts a plot of multiple corrective actions versus a number of dummy cells with Vth<Vdem. In this approach, a first corrective action is to provide a voltage adjustment, e.g., in the read voltage, initial program voltage and/or erase voltage, when there are at least a number N1 (but no more than N2) of the low-Vth dummy memory cells. A second corrective action is to mark a block, or other set of cells, as being bad when there are at least a number N2>N1 of the low-Vth dummy memory cells. The corrective action thus becomes progressively more severe with an increase in the number of low-Vth dummy memory cells.

In an example implementation, a control circuit, to perform a corrective action, is configured to lower a read voltage for a highest programmed data state in a read operation involving selected data memory cells of one set of memory cells if one number (N1) of the dummy memory cells have a threshold voltage below the demarcation voltage, and to identify the block as being bad so that subsequent programming or erasing of the block is prevented if another number (N2) of the dummy memory cells have a threshold voltage below the demarcation voltage, wherein the one number is less than the another number.

Figure 15C:
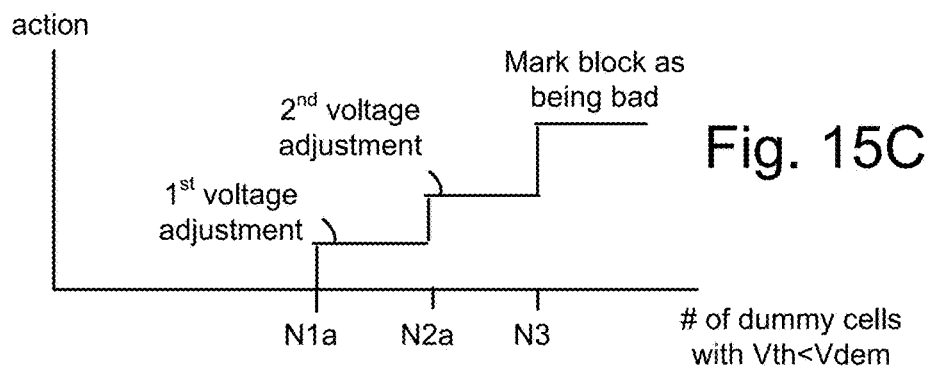
FIG. 15C depicts another plot of multiple corrective actions versus a number of dummy cells with Vth<Vdem.

FIG. 15C depicts another plot of multiple corrective actions versus a number of dummy cells with Vth<Vdem. In this approach, a first corrective action is to provide a first voltage adjustment, e.g., using VrG_int instead of VrG, when there are at least a number N1a (but no more than N2a) of the low-Vth dummy memory cells. A second corrective action is to provide a second voltage adjustment (which is greater than the first voltage adjustment) e.g., using VrG_mid-range instead of VrG, when there are at least a number N2a>N1a (but no more than N3) of the low-Vth dummy memory cells. A third corrective action is to mark a block, or other set of cells, as being bad when there are at least a number N3>N2a of the low-Vth dummy memory cells.

In an example implementation, a control circuit, to perform a corrective action, is configured to lower a read voltage to a first voltage (e.g., from VrG to VrG_int) for a highest programmed data state (e.g., G state) in a read operation involving selected data memory cells of the one set of memory cells if one number (N1a) of the dummy memory cells have a threshold voltage below the demarcation voltage, and to lower the read voltage to a second voltage (e.g., from VrG to VrG_edge or Vr_mid-range) if another number (N2a) of the dummy memory cells have a threshold voltage below the demarcation voltage, wherein the one number is less than the another number and the first voltage is greater than the second voltage.

Figure 16:
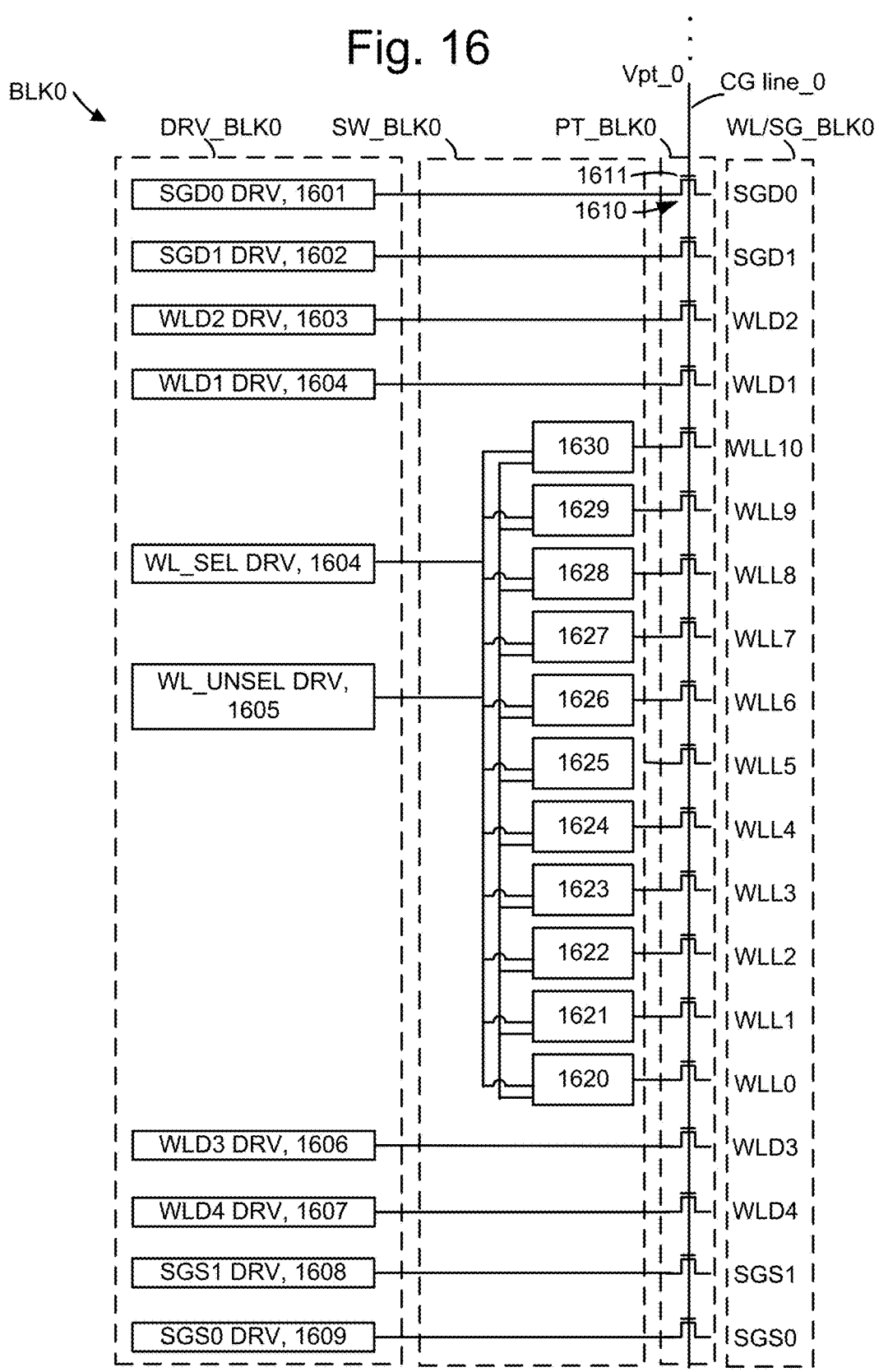
FIG. 16 depicts an example circuit which includes voltage drivers DRV_BLK0, switches SW_BLK0, pass transistors PT_BLK0 and word lines and select gate lines WL/SG_BLK0 of a block BLK0.

FIG. 16 depicts an example circuit which includes voltage drivers DRV_BLK0, switches SW_BLK0, pass transistors PT_BLK0 and word lines and select gate lines WL/SG_BLK0 of a block BLK0. DRV_BLK0 includes various voltage drivers, such as charge pumps. These may be provided as part of the power control module 116 of FIG. 1, for example. An SGD0 driver 1601 provides a voltage to an SGD0 control line. An SGD1 driver 1602 provides a voltage to an SGD1 control line. A WLD2 driver 1603 provides a voltage to a WLD2 word line. A WLD1 driver 1604 provides a voltage to a WLD1 word line. A WL_SEL driver 1604 provides a voltage to any of the data word lines WLL0-WLL10 which is selected for programming or reading. These voltages could include a program voltage, a verify voltage and a read voltage. Optionally, these can be provided by separate voltage drivers.

A WL_UNSEL driver 1605 provides a voltage to any of the data word lines WLL0-WLL10 which is unselected. These voltages could include a pass voltage Vpass.

A WLD3 driver 1606 provides a voltage to a WLD3 word line. A WLD4 driver 1607 provides a voltage to a WLD4 word line. An SGS1 driver 1608 provides a voltage to an SGS1 control line. An SGS0 driver 1609 provides a voltage to an SGS0 control line.

A set of switches 1620-1630 in SW_BLK0 are responsive to control signals to pass the voltage from one of the drivers 1604 or 1605 to the respective data word line. Switches 1620, 1621, 1622, 1623, 1624, 1625, 1626, 1627, 1628, 1629 and 1630 are used for word lines WLL0-WLL10, respectively. The switches 1620-1630 can also be controlled to disconnect a driver from the respective data word line.

PT_BLK0 includes an example pass transistor 1610 having a control gate 1611. As mentioned, the control gates of the pass transistors in a group of blocks are connected to one another and receive a common control gate voltage, e.g., Vpt_0.

The voltage drivers can be used to provide to functions described herein. For example, the dummy word line drivers 1604 and/or 1606 can be used to apply Vdem to the dummy memory cells in an evaluation as described herein.

In one approach, an apparatus comprises: one set of memory cells in a block, the one set of memory cells comprising data memory cells and dummy memory cells; and a control circuit, the control circuit is configured to perform an evaluation of threshold voltages of the dummy memory cells and based on the evaluation, decide whether to perform a corrective action for the data memory cells.

In another approach, a method comprises: measuring an endurance of dummy memory cells in a set of memory cells; and if the endurance is below a threshold, performing a corrective action for data memory cells in the set of memory cells.

In another approach, an apparatus includes means for measuring an endurance of dummy memory cells in a set of memory cells, wherein the dummy memory cells are adjacent to edge data memory cells in strings; and means for performing a corrective action for the edge data memory cells responsive to the means for measuring the endurance. The means can include the components of the memory device 100 of FIG. 1, for example. The power control module 116, for instance, controls the power and voltages supplied to the word lines, select gate lines and bit lines during memory operations. The control circuits in FIG. 1 such as the control circuitry 110 and controller 122 may control other components to perform the functions described herein. Moreover, the means described above can include the components of FIG. 16 including the voltage drivers, switches and pass transistors.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
one set of memory cells in a block, the one set of memory cells comprising data memory cells and dummy memory cells arranged in NAND strings, each NAND string comprising one of the data memory cells adjacent to one of the dummy memory cell; and
a control circuit, the control circuit is configured to:
program threshold voltages of the dummy memory cells to a voltage above a verify level, wherein the threshold voltages of the dummy memory cells are exceeded by threshold voltages of a highest programmed data state of the data memory cells;
perform an evaluation of the threshold voltages of the dummy memory cells, the evaluation determines a number of the dummy memory cells for which the threshold voltages have downshifted below a demarcation voltage; and
based on the number of the dummy memory cells for which the threshold voltages have downshifted below the demarcation voltage, perform a corrective action for the data memory cells, wherein the control circuit, to perform the corrective action, is configured to lower a read voltage for the highest programmed data state in a read operation involving the data memory cells when the number of the dummy memory cells for which the threshold voltages have downshifted below the demarcation voltage exceeds a first number N1 but not a second number N2>N1, and to recover data from the data memory cells when the number of the dummy memory cells for which the threshold voltages have downshifted below the demarcation voltage exceeds the second number N2.

2. The apparatus of claim 1, wherein:
the one set of memory cells is in one sub-block of a block;
another set of memory cells comprising data memory cells and dummy memory cells is in another sub-block of the block; and
the control circuit is configured to perform the evaluation separate from an evaluation of threshold voltages of the dummy memory cells in the another sub-block, and based on the evaluation of the threshold voltages of the dummy memory cells in the another sub-block, to perform the corrective action for the data memory cells of the another set of memory cells, separately from the performing the corrective action for the data memory cells of the one set of memory cells.

3. The apparatus of claim 2, wherein:
the one set of memory cells are in NAND strings in the one sub-block; and
the another set of memory cells are in NAND strings in the another sub-block.

4. The apparatus of claim 1, wherein:
the evaluation compares the number of the dummy memory cells for which the threshold voltages have downshifted below the demarcation voltage to a specified number; and
the circuit is configured to determine the specified number as a function of a number of program-erase cycles in the block.

5. The apparatus of claim 1, wherein:
the read operation involves selected data memory cells of the one set of memory cells; and
to perform the corrective action, the control circuit is configured to lower the read voltage based on a position of the selected data memory cells in the NAND strings such that the read voltage is lower when the selected data memory cells are at an edge of the NAND strings than when the selected data memory cells are not at an edge of the NAND strings.

6. The apparatus of claim 1, wherein:
the control circuit, to perform the corrective action, is configured to use a lower initial program voltage in a next programming operation for the one set of memory cells compared to an initial program voltage used in a past programming operation for the one set of memory cells.

7. The apparatus of claim 1, wherein:
the control circuit, to perform the corrective action, is configured to use a higher initial erase voltage in a next erase operation for the one set of memory cells compared to an initial erase voltage used in a past erasing operation for the one set of memory cells.

8. The apparatus of claim 1, wherein:
the control circuit is configured to perform a plurality of program-erase cycles for the data memory cells; and
the evaluation determines an amount by which the threshold voltages of the dummy memory cells have downshifted below the demarcation voltage after the plurality of program-erase cycles.

9. The apparatus of claim 1, wherein:
the control circuit is configured to trigger the evaluation of the dummy memory cells in response to a determination that a number of program-erase cycles in the block has reached a threshold.

10. The apparatus of claim 1, wherein:
the control circuit is configured to trigger the evaluation of the dummy memory cells in response to a command to perform a read operation involving selected data memory cells of the one set of memory cells, and to perform the corrective action during the read operation.

11. The apparatus of claim 1, wherein:
the control circuit is configured to erase the dummy memory cells less deeply than the data memory cells in an erase operation.

12. The apparatus of claim 1, wherein:
the data memory cells are programmed to a plurality of programmed data states including a top half of the programmed states and a bottom half of the programmed states; and
the threshold voltages of the dummy memory cells are among lower states in the bottom half of the programmed states.

13. The apparatus of claim 1, wherein:
the control circuit is configured to set a flag in a register indicating the block is bad when the number of the dummy memory cells for which the threshold voltages have downshifted below the demarcation voltage exceeds a specified number.

14. The apparatus of claim 1, wherein:
to perform the corrective action, the control circuit is configured to mark the data memory cells as having a reduced endurance when the number of the dummy memory cells for which the threshold voltages have downshifted below the demarcation voltage exceeds the first number N1 but not the second number N2.

15. A method, comprising:
programming threshold voltages of dummy memory cells in a set of memory cells to a voltage above a verify level, wherein the dummy memory cells are adjacent to data memory cells in NAND strings;
determining a degree to which the threshold voltages have downshifted after a specified number of program-erase cycles of the data memory cells in which threshold voltages of the dummy memory cells are exceeded by threshold voltages of a highest programmed data state of the data memory cells by determining a number of the dummy memory cells having a threshold voltage below a demarcation voltage; and
performing a corrective action for the data memory cells based on the number of dummy memory cells having the threshold voltage below the demarcation voltage, wherein the performing the corrective action comprises lowering a read voltage for a highest programmed data state in a read operation involving the data memory cells when the number of the dummy memory cells having the threshold voltage below the demarcation voltage exceeds a first number but not a second number, and recovering data from the data memory cells when the number of the dummy memory cells having the threshold voltage below the demarcation voltage exceeds the second number.

16. The method of claim 15, wherein:
the lowering the read voltage comprises lowering the read voltage by a first adjustment amount when the number of dummy memory cells having the threshold voltage below the demarcation voltage is between the first number and another number which is higher than the first number and lower than the second number and by a second adjustment amount when the number of dummy memory cells having the threshold voltage below the demarcation voltage is between the another number and the second number;
the another number is greater than the one number; and
the second adjustment amount is greater than the first adjustment amount.

17. An apparatus, comprising:
one set of memory cells in a block, the one set of memory cells comprising data memory cells and dummy memory cells arranged in NAND strings, each NAND string comprising one of the data memory cells adjacent to one of the dummy memory cell; and
a control circuit, the control circuit is configured to:
program threshold voltages of the dummy memory cells to a voltage above a verify level, wherein the threshold voltages of the dummy memory cells are exceeded by threshold voltages of a highest programmed data state of the data memory cells;
perform an evaluation of the threshold voltages of the dummy memory cells, the evaluation determines a number of the dummy memory cells for which the threshold voltages have downshifted below a demarcation voltage; and
based on the number of the dummy memory cells for which the threshold voltages have downshifted below the demarcation voltage, perform a corrective action for the data memory cells, wherein the evaluation compares the number of the dummy memory cells for which the threshold voltages have downshifted below the demarcation voltage to a specified number, the block is among a plurality of blocks in a memory device, and the control circuit is configured to dynamically adjust the specified number based on an evaluation of threshold voltages of dummy memory cells in the plurality of blocks.

18. The apparatus of claim 17, wherein:
the control circuit is configured to dynamically adjust the specified number to cause a specified portion of memory cells in the plurality of blocks to be subject to the corrective action.

19. The apparatus of claim 17, wherein:
the control circuit is configured to adjust the demarcation voltage to cause a specified portion of memory cells in the plurality of blocks to be subject to the corrective action.

* * * * *